United States Patent
Tamura et al.

(10) Patent No.: US 11,209,466 B2
(45) Date of Patent: Dec. 28, 2021

(54) CURRENT SENSOR

(71) Applicant: Alps Alpine Co., Ltd., Tokyo (JP)

(72) Inventors: Manabu Tamura, Miyagi-ken (JP); Minoru Abe, Miyagi-ken (JP); Ken Matsue, Miyagi-ken (JP); Yasuo Kotera, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 229 days.

(21) Appl. No.: 16/519,332

(22) Filed: Jul. 23, 2019

(65) Prior Publication Data

US 2019/0346489 A1 Nov. 14, 2019

Related U.S. Application Data

(63) Continuation of application No. PCT/JP2018/001427, filed on Jan. 18, 2018.

(30) Foreign Application Priority Data

Feb. 17, 2017 (JP) .............................. JP2017-028542

(51) Int. Cl.
  *G01R 19/00* (2006.01)
  *G01R 15/20* (2006.01)

(52) U.S. Cl.
  CPC ....... *G01R 19/0092* (2013.01); *G01R 15/207* (2013.01); *G01R 15/205* (2013.01)

(58) Field of Classification Search
  CPC .............. G01R 19/0092; G01R 15/207; G01R 15/205; G01R 31/42
  See application file for complete search history.

(56) References Cited

U.S. PATENT DOCUMENTS 9,599,642 B2 3/2017 Matsue et al.
2017/0082659 A1* 3/2017 Harada .................. G01R 15/20
(Continued)

FOREIGN PATENT DOCUMENTS

| JP | 2016-001168 | 1/2016 |
| JP | 2016-173306 | 9/2016 |
| WO | WO 2016-190087 | 12/2016 |

*Primary Examiner* — Lee E Rodak
*Assistant Examiner* — Feba Pothen
(74) *Attorney, Agent, or Firm* — Crowell & Morning LLP

(57) ABSTRACT

A current sensor includes a plurality of unit groups mounted in a first case and a current sensor includes a first case that is made of a resin and includes a first opposing part, a second case that is made of a resin and includes a second opposing part, a substrate mounted in at least one of the first case and second case, and a plurality of unit groups mounted in the first case and second case, each unit group measuring an induced magnetic field. second case, each unit group measuring an induced magnetic field. Each of the plurality of unit groups includes one or more measurement units arranged in a second direction. A current path and a first magnetic shield, each of which is formed integrally with a first opposing part, are positioned so as to be separated by a first distance. In all unit groups, all first distances are substantially the same. The current path and a magneto-electric conversion element, which is formed integrally with a second opposing part, are positioned so as to be separated by a second distance. In all measurement units included in a unit group shared among them, all second distances are substantially the same. The second distance differs for each unit group. The thickness of the first opposing part in a first direction is substantially constant. The thickness of the second opposing part in the first direction is substantially constant.

18 Claims, 20 Drawing Sheets

(56) References Cited

U.S. PATENT DOCUMENTS

2017/0184635 A1\* 6/2017 Ugge ................... G01R 15/207
2017/0219634 A1\* 8/2017 Shimizu ............... G01R 15/205
2017/0343584 A1\* 11/2017 Abe ..................... G01R 15/148

\* cited by examiner

COMPARATIVE EXAMPLE

CURRENT SENSOR

CLAIM OF PRIORITY

This application is a Continuation of International Application No. PCT/JP2018/001427 filed on Jan. 18, 2018, which claims benefit of priority to Japanese Patent Application No. 2017-028542 filed on Feb. 17, 2017. The entire contents of each application noted above are hereby incorporated by reference.

BACKGROUND

1. Field of the Disclosure

The present disclosure relates to a current sensor.

2. Description of the Related Art

A known current sensor has a current path through which a current flows, a magneto-electric conversion element that measures the current flowing in the current path, and magnetic shields formed from a magnetic substance so as to interpose the current path and magneto-electric conversion element. In other known current sensors, a current path and magnetic shields are formed integrally with a case as disclosed in, for example, Japanese Unexamined Patent Application Publication No. 2016-1168, Japanese Unexamined Patent Application Publication No. 2016-173306, and International Publication No. 2016/190087.

In a hybrid vehicle or an electric car, it is necessary to provide a current sensor for use for an inverter targeted at a driving motor and a current sensor for use for an inverter targeted at a braking dynamo. The magnitude of a current under measurement may differ in different applications. Conventionally, a current sensor for a large current and a current sensor for a small current are separately prepared.

If, however, a plurality of current sensors intended to measure currents having different magnitudes are placed in a limited space such as an engine room, the space cannot be efficiently used. When a measurement unit includes a current path, a magneto-electric conversion element, and one or more magnetic shields as constituent elements, the mutual positional relationship of these constituent elements differs for each measurement unit depending on whether the current to be measured is a large current or a small current. This problematic in that integration cannot be simply achieved. Even if integration is achieved, manufacturing is difficult.

SUMMARY

A current sensor includes a first case that is made of a resin and includes a first opposing part, a second case that is made of a resin and includes a second opposing part, a substrate mounted in at least one of the first case and second case, and a plurality of unit groups mounted in the first case and second case, each unit group measuring an induced magnetic field. The first opposing part and second opposing part are positioned so as to be opposite to each other in a first direction. The plurality of unit groups are arranged in a second direction, which intersects the first direction. Each of the plurality of unit groups includes one or more measurement units arranged in the second direction. Each of the one or more measurement units includes a first magnetic shield formed integrally with the first opposing part, a second magnetic shield formed integrally with the second opposing part, a current path formed integrally with the first opposing part between the first magnetic shield and the second magnetic shield, and a magneto-electric conversion element that measures an induced magnetic field generated by a current flowing in the current path. The magneto-electric conversion element is mounted, on the substrate, between the current path and the second magnetic shield in the first direction.

The current path and first magnetic shield that are included in the measurement unit shared between them are positioned so as to be separated by a first distance in the first direction. In all unit groups, all first distances are substantially the same. The current path and magneto-electric conversion element that are included in the measurement unit shared between them are positioned so as to be separated by a second distance in the first direction. In all measurement units included in the unit group shared among them, all second distances are substantially the same. The second distance differs for each unit group. The thickness of the first opposing part in the first direction is substantially constant. The thickness of the second opposing part in the first direction is substantially constant.

Accordingly to this structure, resin molding can be easily performed. In a structure in which the second distance differs for each unit group, since each of the thickness of the first opposing part, the thickness of the second opposing part, and the first distance is substantially constant, so a resin is likely to flow in a mold during manufacturing. As a result, even if the positional relationship of constituent elements is not constant among a plurality of measurement units that measure an induced magnetic field, a current sensor can be provided that enables the plurality of measurement units to be integrally manufactured with ease.

Accordingly, even if the positional relationship of constituent elements is not constant among a plurality of measurement units that measure an induced magnetic field, the plurality of measurement units can be integrally manufactured with ease.

DESCRIPTION OF THE EXEMPLARY EMBODIMENTS

In this specification, an x direction, a y direction, and a z direction, which are mutually orthogonal, are stipulated. The x direction is represented without distinguishing between an x1 direction and an x2 direction, which are mutually opposite. The y direction is represented without distinguishing between a y1 direction and y2 direction, which are mutually opposite. The z direction is represented without distinguishing between a z1 direction and z2 direction, which are mutually opposite. An x1 side will sometimes be represented as left, and an x2 side will sometimes be represented as right. A z1 side will sometimes be represented as up, and a z2 side will sometimes be represented as down. These directions are stipulated for the sake of convenience to explain relative positional relationships, and do not restrict directions in actual usage. The shapes of constituent elements are not limited to strict geometrical shapes based on described representations regardless of whether "substantially" is described as long as the technical concept of the embodiments disclosed in this specification is implemented.

First Embodiment

Figure 1:
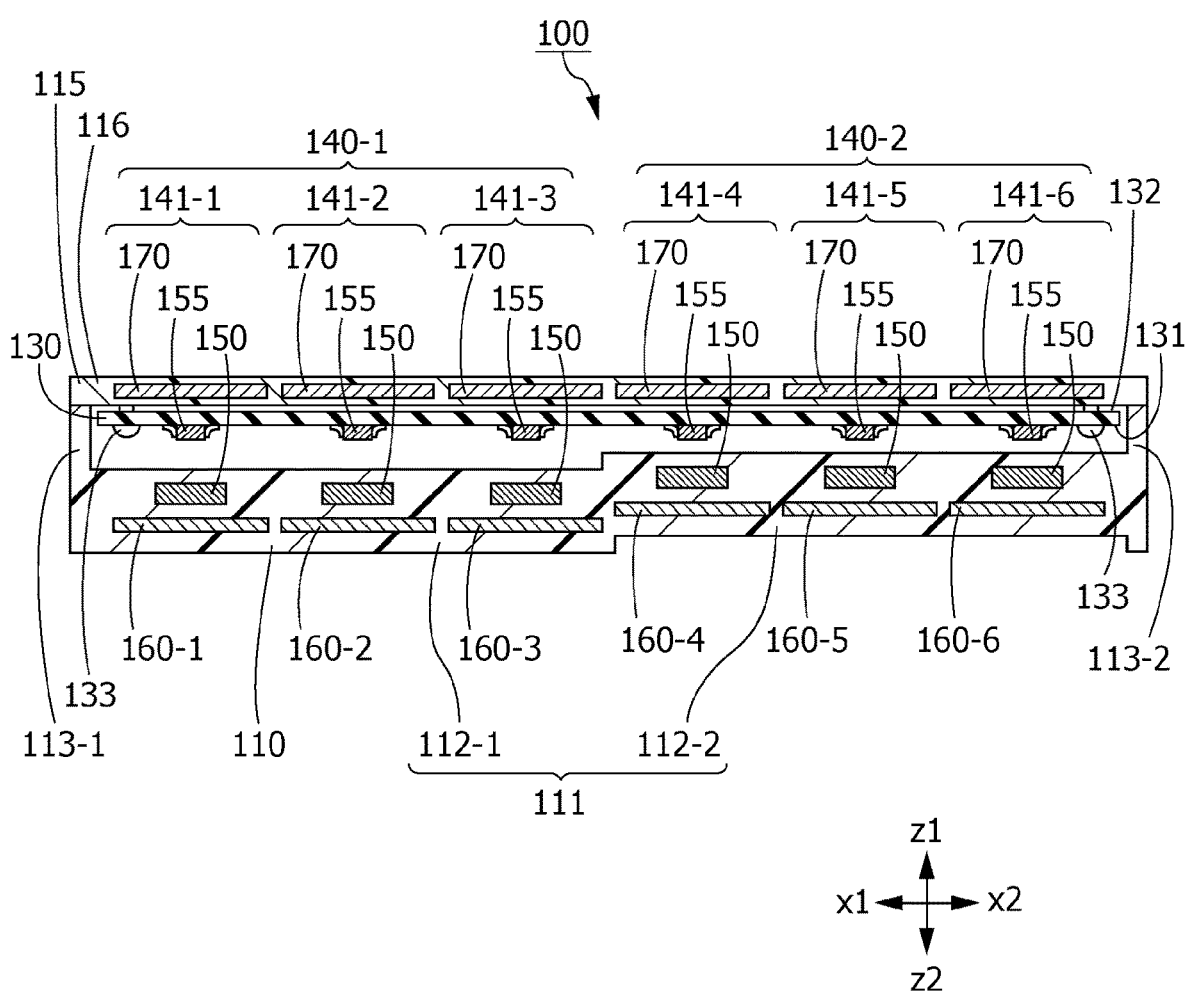
FIG. 1 is a cross-sectional view of a current sensor in a first embodiment.

A current sensor according to a first embodiment of the present invention will be described below. FIG. 1 is a cross-sectional view of the current sensor 100 in this embodiment at a cross section parallel to a zx plane. The y1 and y2 directions are orthogonal to the cross section indicated in FIG. 1. The y1 direction extends out of the drawing sheet, and the y2 direction extends into the drawing sheet.
Entire Structure The current sensor 100 includes a first case 110 made of a resin, a second case 115 made of a resin, a substrate 130 made of an insulating material, the substrate 130 being mounted in the second case 115, two fixing members 133 that secure the substrate 130 to the second case 115, and a large-current unit group 140-1 and small-current unit group 140-2 that measure an induced magnetic field, the large-current unit group 140-1 and small-current unit group 140-2 being mounted in the first case 110 and second case 115.
First Case The first case 110 includes a first opposing part 111. The first opposing part 111 includes a left first sub-opposing part 112-1 and a right first sub-opposing part 112-2, which are integrally formed together (sometimes referred to below as first sub-opposing parts 112 without distinguishing between them). Each of the two first sub-opposing parts 112 is like a substantially flat plate that has two surfaces substantially parallel to an xy plane and expands substantially in parallel to the xy plane. The end of the left first sub-opposing part 112-1 on the x2 side and the end of the right first sub-opposing part 112-2 on the x1 side are mutually linked. The two first sub-opposing parts 112 are at positions shifted mutually by a predetermined amount in the z direction (also referred to as the first direction).

For each of the two first sub-opposing parts 112, the thickness in the z direction is substantially constant at any position. That is, the thickness in the z direction is substantially constant as the whole of the first opposing part 111. In another example as well, the first opposing part 111 may include a plurality of first sub-opposing parts 112 other than two first sub-opposing parts 112.

The first case 110 further includes a first support part 113-1 extending from the end of the first opposing part 111 on the x1 side in the z1 direction and a second support part 113-2 extending from the end of the first opposing part 111 on the x2 side in the z1 direction. The first case 110 extends in the y direction across a predetermined length while having the cross section illustrated in FIG. 1.
Second Case The second case 115 includes a second opposing part 116. In this embodiment, the whole of the second case 115 is the second opposing part 116. In another example, the second case 115 may include other constituent elements. The second opposing part 116 is like a substantially flat plate that has two surfaces substantially parallel to an xy plane and expands substantially in parallel to the xy plane. The thickness of the second opposing part 116 in the z direction is substantially constant at any position.

The end of the second opposing part 116 on the x1 side is secured to the end of the first support part 113-1 on the z1 side. The end of the second opposing part 116 on the x2 side is secured to the end of the second support part 113-2 on the z1 side. The first opposing part 111 and second opposing part 116 are positioned so as to be partially opposite to each other in the z direction. The first opposing part 111 and second opposing part 116 are spaced apart. The second case 115 extends in the y direction across a predetermined length while having the cross section illustrated in FIG. 1.
Substrate and Fixing Member The substrate 130 is positioned between the first opposing part 111 and the second opposing part 116 in the z direction. The substrate 130 is positioned between the first support part 113-1 and the second support part 113-2 in the x direction. The substrate 130 is secured to the second opposing part 116 by a plurality of fixing members 133. The substrate 130 is like a substantially flat plate expanding substantially in parallel to an xy plane. The thickness of the substrate 130 in the z direction is substantially constant. The substrate 130 may have a first mounting surface 131 on the same side as the first opposing part 111, and may also have a second mounting surface 132 on the same side as the second opposing part 116. Each of the first mounting surface 131 and second mounting surface 132 is substantially in parallel to an xy plane.

On the substrate 130, various circuits necessary for measurement of an induced magnetic field are mounted. In another example, the substrate 130 is secured to another portion of the second case 115 or to the first case 110. That is, it is preferable for the substrate 130 to be secured to at least one of the first case 110 and second case 115. The substrate 130 extends in the y direction across a predetermined length while having the cross section illustrated in FIG. 1.

Unit Group

The large-current unit group 140-1 and small-current unit group 140-2 (sometimes referred to below as the unit groups 140 without distinguishing between them) may be arranged so as to be adjacent in the x direction (also referred to as the second direction). The large-current unit group 140-1 measures a larger current than the small-current unit group 140-2.

In another example, the current sensor 100 may include three or more unit groups 140. If the current sensor 100 includes three or more unit groups 140, one of adjacent unit groups 140 that measures a relatively large current corresponds to the large-current unit group 140-1 and the other of the adjacent unit groups 140 that measures a relatively small current corresponds to the small-current unit group 140-2. In another example, the direction in which the two unit groups 140 are arranged may be another direction intersecting the z direction.

Each of the two first sub-opposing parts 112 corresponds to a different unit group 140. Specifically, the left first sub-opposing part 112-1 corresponds to the large-current unit group 140-1. That is, constituent elements that measure a relatively large current are positioned in the left first sub-opposing part 112-1, as will be described later. The right first sub-opposing part 112-2 corresponds to the small-current unit group 140-2. That is, constituent elements that measure a relatively small current are positioned in the right first sub-opposing part 112-2, as will be described later.

Measurement Unit

The large-current unit group 140-1 includes a first measurement unit 141-1 to a third measurement unit 141-3, which are arranged from the x1 side toward the x2 side. The small-current unit group 140-2 includes a fourth measurement unit 141-4 to a sixth measurement unit 141-6, which are arranged from the x1 side toward the x2 side. The first measurement unit 141-1 to sixth measurement unit 141-6 will sometimes be referred to below as the measurement units 141 without distinguishing between them.

Each of the six measurement units 141 includes a current path 150 formed integrally with the first opposing part 111 and a magneto-electric conversion element 155 mounted on the substrate 130, and a second magnetic shield 170 formed integrally with the second opposing part 116. The first measurement unit 141-1 to sixth 141-6 include a first magnetic shield 160-1 to a first magnetic shield 160-6 (sometimes referred to below as first magnetic shields 160 without distinguishing between them), respectively. That is, each of the six measurement units 141 has one first magnetic shield 160 formed integrally with the first opposing part 111.

In another example, each of the plurality of unit groups 140 may include two or less or four or more measurement units 141. In this embodiment, each of the plurality of unit groups 140 includes the same number of measurement units 141. In another example, however, each of the plurality of unit groups 140 may include a different number of measurement units 141.

Current Path

The current path 150 is made of a metal and is formed integrally with the first opposing part 111. The cross section of the current path 150 is substantially a rectangle that has two sides parallel to the x direction and two sides parallel to the z direction. The current path 150 extends in the y direction across a predetermined length while having the cross section illustrated in FIG. 1. The current path 150 extends to the outside of the first case 110 and causes a current supplied from the outside to flow in the y direction. The current path 150 has substantially the same shape within a predetermined range having a predetermined length in the y direction.

The current path 150 included in each of the two unit groups 140 is positioned in the corresponding first sub-opposing part 112.

Specifically, the three current paths 150 included in the large-current unit group 140-1 are positioned in the left first sub-opposing part 112-1. In the z direction, the distances from the surface of the left first sub-opposing part 112-1 on the z1 side to the three current paths 150 are substantially constant. Also, in the z direction, the distances from the surface of the left first sub-opposing part 112-1 on the z2 side to the current paths 150 are substantially constant. The three current paths 150 included in the large-current unit group 140-1 are spaced in the x direction at equal intervals along substantially the same planes that are in parallel to an xy plane.

The three current paths 150 included in the small-current unit group 140-2 are positioned in the right first sub-opposing part 112-2. In the z direction, the distances from the surface of the right first sub-opposing part 112-2 on the z1 side to the current paths 150 are substantially constant. In the z direction, the distance from the surface of the right first sub-opposing part 112-2 on the z2 side to the current paths 150 are substantially constant. The three current paths 150 included in the small-current unit group 140-2 are spaced in the x direction at equal intervals along substantially the same planes that are in parallel to an xy plane.

The intervals of the six current paths 150 in the x direction are substantially equal. The three current paths 150 included in the small-current unit group 140-2 are shifted in the z1 direction from the three current paths 150 included in the large-current unit group 140-1. The amount of shift of the current path 150 in the z direction is smaller than the thickness of the current path 150 in the z direction and is substantially equal to the predetermined amount of shift of the first sub-opposing part 112.

Magneto-Electric Conversion Element

All magneto-electric conversion elements 155 are mounted on a single substrate 130, which is substantially like a plane. The magneto-electric conversion element 155 is mounted on the first mounting surface 131 of the substrate 130. The magneto-electric conversion element 155 is, for example, a magnetoresistance effect element or a Hall element.

The magneto-electric conversion element 155 measures an induced magnetic field generated by a current flowing in the current path 150 in the measurement unit 141 shared between the magneto-electric conversion element 155 and the current path 150. The magneto-electric conversion element 155 takes the x direction as a sensitivity direction. That is, the magneto-electric conversion element 155 detects an x-direction component, in the magneto-electric conversion element 155, of an induced magnetic field generated around the current path 150.

First Magnetic Field

The first magnetic shield 160 is made of a magnetic substance and is formed integrally with the first opposing part 111. The cross section of the first magnetic shield 160 is substantially a rectangle that has two sides parallel to the x direction and two sides parallel to the z direction. The first magnetic shield 160 extends in the y direction across a predetermined length while having the cross section illustrated in FIG. 1. As a whole, the first magnetic shield 160 is substantially a rectangular parallelepiped that has two surfaces parallel to an xy plane, two surfaces parallel to a yz plane, and two surfaces parallel to a zx plane. The first magnetic shield 160 is like a plate extending along a plane substantially orthogonal to the z direction. The shapes of all first magnetic shields 160 may be substantially the same.

The first magnetic shield 160 included in each of the two unit groups 140 is positioned in the corresponding first sub-opposing part 112.

Specifically, the three first magnetic shields 160 included in the large-current unit group 140-1 are positioned in the left first sub-opposing part 112-1. The distances from the surface of the left first sub-opposing part 112-1 on the z1 side to the three first magnetic shields 160 are substantially constant, and the distances from the surface of the left first sub-opposing part 112-1 on the z2 side to the three first magnetic shields 160 are substantially constant. The three first magnetic shields 160 included in the large-current unit group 140-1 expand along substantially the same planes that are in parallel to an xy plane, and are spaced in the x direction at equal intervals.

The three first magnetic shields 160 included in the small-current unit group 140-2 are positioned in the right first sub-opposing part 112-2.

The distances from the surface of the right first sub-opposing part 112-2 on the z1 side to the three first magnetic shields 160 are substantially constant, and the distance from the surface of the right first sub-opposing part 112-2 on the z2 side to the three first magnetic shields 160 are substantially constant. The three first magnetic shields 160 included in the small-current unit group 140-2 expand along substantially the same planes that are in parallel to an xy plane, and are spaced in the x direction at equal intervals.

The intervals of the six first magnetic shields 160 in the x direction are substantially equal. The three first magnetic shields 160 included in the small-current unit group 140-2 are shifted in the z1 direction from the three first magnetic shields 160 included in the large-current unit group 140-1. The amount of shift of the first magnetic shield 160 in the z direction is substantially the same as the thickness of the first magnetic shield 160 in the z direction and is substantially the same as the predetermined amount of shift of the first sub-opposing part 112. The predetermined amount of shift of the first sub-opposing part 112, the amount of shift of the first magnetic shield 160, and the amount of shift of the current path 150 are not limited to the amounts described in this embodiment.

Second Magnetic Shield

The second magnetic shield 170 is made of a magnetic substance and is formed integrally with the second opposing part 116. The cross section of the second magnetic shield 170 is substantially a rectangle that has two sides parallel to the x direction and two sides parallel to the z direction. The second magnetic shield 170 extends in the y direction across a predetermined length while having the cross section illustrated in FIG. 1. As a whole, the second magnetic shield 170 is substantially a rectangular parallelepiped that has two surfaces parallel to an xy plane, two surfaces parallel to a yz plane, and two surfaces parallel to a zx plane. The second magnetic shield 170 is like a plate extending along a plane substantially orthogonal to the z direction. The shapes of all second magnetic shields 170 are substantially the same.

The six second magnetic shields 170 expand along substantially the same planes that are in parallel to an xy plane, and are spaced in the x direction at equal intervals. The second magnetic shield 170 is positioned substantially at the center of the second opposing part 116 in the z direction. The second magnetic shield 170 has substantially the same shape as the first magnetic shield 160.

Mutual Relationship

A mutual relationship of the constituent elements of each measurement unit 141 will be described. The current path 150 is positioned between the first magnetic shield 160 and the second magnetic shield 170. The magneto-electric conversion element 155 is mounted, on the substrate 130, between the current path 150 and the second magnetic shield 170.

The current path 150, magneto-electric conversion element 155, first magnetic shield 160, and second magnetic shield 170 are at positions at which they overlap when viewed from the z direction. The centers of the current path 150, magneto-electric conversion element 155, first magnetic shield 160, and second magnetic shield 170 in the x direction are positioned substantially on a straight line parallel to the z direction. The second magnetic shield 170 is at a position reflecting translation of the first magnetic shield 160 in the z1 direction. The width of the magneto-electric conversion element 155 in the x direction is smaller than the width of the current path 150 in the x direction. The widths of the first magnetic shield 160 and second magnetic shield 170 in the x direction are larger than the width of the current path 150 in the x direction.

The centers of the magneto-electric conversion element 155, first magnetic shield 160, and second magnetic shield 170 in the y direction are positioned substantially on a straight line parallel to the z direction. The widths of the first magnetic shield 160 and second magnetic shield 170 in the y direction are larger the width of the magneto-electric conversion element 155 in the y direction. An area, in the current path 150, that linearly extends in the y direction is longer than the width of the magneto-electric conversion element 155 in the y direction.

The current path 150 and first magnetic shield 160 that are included in the measurement unit 141 shared between them are positioned so as to be separated by a first distance in the z direction. In all unit groups 140, all first distances are substantially the same. That is, the first distance in the large-current unit group 140-1 and the first distance in the small-current unit group 140-2 are substantially the same.

The current path 150 and magneto-electric conversion element 155 that are included in the measurement unit 141 shared between them are positioned so as to be separated by a second distance in the z direction. In all measurement units 141 included in the unit group 140 shared among them, all second distances are substantially the same. That is, all second distances in the large-current unit group 140-1 are substantially the same and all second distances in the small-current unit group 140-2 are substantially the same. The second distance differs for each unit group 140. Specifically, the second distance in the small-current unit group 140-2 is smaller than the second distance in the large-current unit group 140-1.

The magneto-electric conversion element 155 and second magnetic shield 170 that are included in the measurement unit 141 shared between them may be positioned so as to be separated by a third distance in the z direction. In all measurement units 141, the third distance may be shorter than the second distance. In all measurement units 141, all third distances may be substantially the same.

The current path 150 and second magnetic shield 170 that are included in the measurement unit 141 shared between them may be positioned so as to be separated by a fourth distance in the first direction. The fourth distance in the large-current unit group 140-1 may be longer than the fourth distance in the small-current unit group 140-2.

The first magnetic shield 160 and second magnetic shield 170 that are included in the measurement unit 141 shared between them may be positioned so as to be separated by a fifth distance in the first direction. The fifth distance in the large-current unit group 140-1 may be longer than the fifth distance in the small-current unit group 140-2.

All magneto-electric conversion elements 155 are positioned on the same plane substantially parallel to an xy plane. The three current paths 150 included in the small-current unit group 140-2 are closer to the respective magneto-electric conversion element 155 than are the three current paths 150 included in the large-current unit group 140-1. Therefore, in the small-current unit group 140-2, a relatively small current can be measured with high precision. In addition, the magneto-electric conversion element 155 in the fourth measurement unit 141-4 is positioned farther away from the current path 150 in the third measurement unit 141-3 when compared with when all current paths 150 are positioned on the same plane. As a result, the magneto-electric conversion element 155 in the fourth measurement unit 141-4 is less likely to receive noise from the current path 150 in the third measurement unit 141-3.

Conclusion

This embodiment includes the first case 110 that is made of a resin and includes the first opposing part 111, the second case 115 that is made of a resin and includes the second opposing part 116, the substrate 130 mounted in at least one of the first case 110 and second case 115, and a plurality of unit groups 140 mounted in the first case 110 and second case 115, each unit group 140 measuring an induced magnetic field. The first opposing part 111 and second opposing part 116 are positioned so as to be opposite to each other in the first direction. The plurality of unit groups 140 are arranged in the second direction, which intersects the first direction. Each of the plurality of unit groups 140 includes one or more measurement units 141 arranged in the second direction. Each of the one or more measurement units 141 includes the first magnetic shield 160 formed integrally with the first opposing part 111, the second magnetic shield 170 formed integrally with the second opposing part 116, the current path 150 formed integrally with the first opposing part 111 between the first magnetic shield 160 and the second magnetic shield 170, and the magneto-electric conversion element 155 that measures an induced magnetic field generated by a current flowing in the current path 150. The magneto-electric conversion element 155 is mounted, on the substrate 130, between the current path 150 and the second magnetic shield 170 in the first direction. The current path 150 and first magnetic shield 160 that are included in the measurement unit 141 shared between them are positioned so as to be separated by the first distance in the first direction. In all unit groups 140, all first distances are substantially the same.

The current path 150 and magneto-electric conversion element 155 that are included in the measurement unit 141 shared between them are positioned so as to be separated by the second distance in the first direction. In all measurement units 141 included in the unit group 140 shared among them, all second distances are substantially the same. The second distance differs for each unit group 140. The thickness of the first opposing part 111 in the first direction is substantially constant. The thickness of the second opposing part 116 in the first direction is substantially constant. Accordingly, resin molding can be easily performed. In a structure in which the second distance differs for each unit group 140, since each of the thickness of the first opposing part 111, the thickness of the second opposing part 116, and the first distance is substantially constant, so a resin is likely to flow in a mold during manufacturing. As a result, even if the positional relationship of constituent elements is not constant among a plurality of measurement units 141 that measure an induced magnetic field, the current sensor 100 can be provided that enables the plurality of measurement units 141 to be integrally manufactured with ease.

According to this embodiment, the magneto-electric conversion element 155 and second magnetic shield 170 that are included in the measurement unit 141 shared between them may be positioned so as to be separated by the third distance in the first direction. In all measurement units 141, the third distance may be shorter than the second distance. In all measurement units 141, all third distances may be substantially the same. Therefore, measurement precision can be made higher than in another placement.

According to this embodiment, all second magnetic shields 170 may be positioned on substantially the same planes and all magneto-electric conversion elements 155 may be mounted on one substrate 130, which is substantially like a plane, so the second case 115 and substrate 130 can be easily manufactured. Furthermore, since the first opposing part 111 may include a plurality of first sub-opposing parts 112, which are integrally formed together, each of the plurality of first sub-opposing parts 112 may be substantially like a plane, the plurality of first sub-opposing parts 112 may be at positions shifted mutually in the first direction, each of the plurality of first sub-opposing parts 112 may correspond to one different unit group 140, and the current paths 150 and first magnetic shields 160 that are included in each of the plurality of unit groups 140 may be positioned in the corresponding first sub-opposing part 112. Therefore, the first case 110 can be easily manufactured.

Second Embodiment

Figure 2:
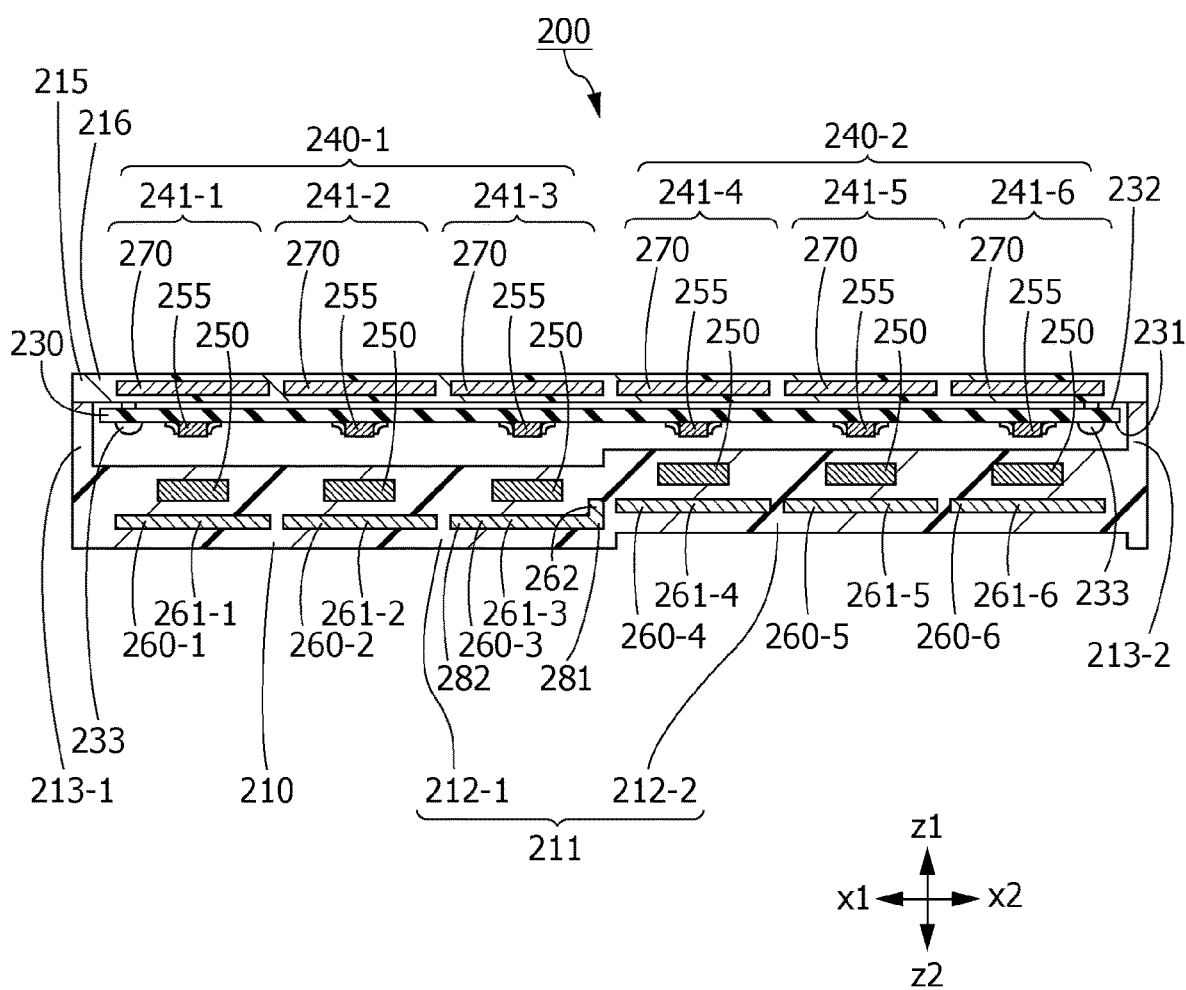
FIG. 2 is a cross-sectional view of a current sensor in a second embodiment.

Next, a current sensor in a second embodiment will be described. FIG. 2 is a cross-sectional view of the current sensor 200 in this embodiment at a cross section parallel to a zx plane. Differences between the current sensor 100 (FIG. 1) in the first embodiment and the current sensor 200 in this embodiment will be mainly described below. For the current sensor 100, illustrated in FIG. 1, in the first embodiment, the hundred's digit of the reference numeral of each constituent element is represented as 1. For the current sensor 200, illustrated in FIG. 2, in this embodiment, the hundred's digit of the reference numeral of each constituent element is represented as 2. Unless otherwise noted, constituent elements that differ only in the hundred's digit are similar to each other.

First magnetic shields 260 in a first measurement unit 241-1 to a sixth measurement unit 241-6 respectively include a plate-like part 261-1 to a plate-like part 261-6 (sometimes referred to below as plate-like parts 261 without distinguishing between them). Each plate-like part 261 has the same shape as the first magnetic shield 160 in the first embodiment (FIG. 1). That is, all first magnetic shields 260 have the plate-like part 261, which expands along a plane substantially orthogonal to the z direction. All plate-like parts 261 included in a large-current unit group 240-1 expand along substantially the same planes. All plate-like parts 261 included in a small-current unit group 240-2 expand along substantially the same planes.

Figure 3:
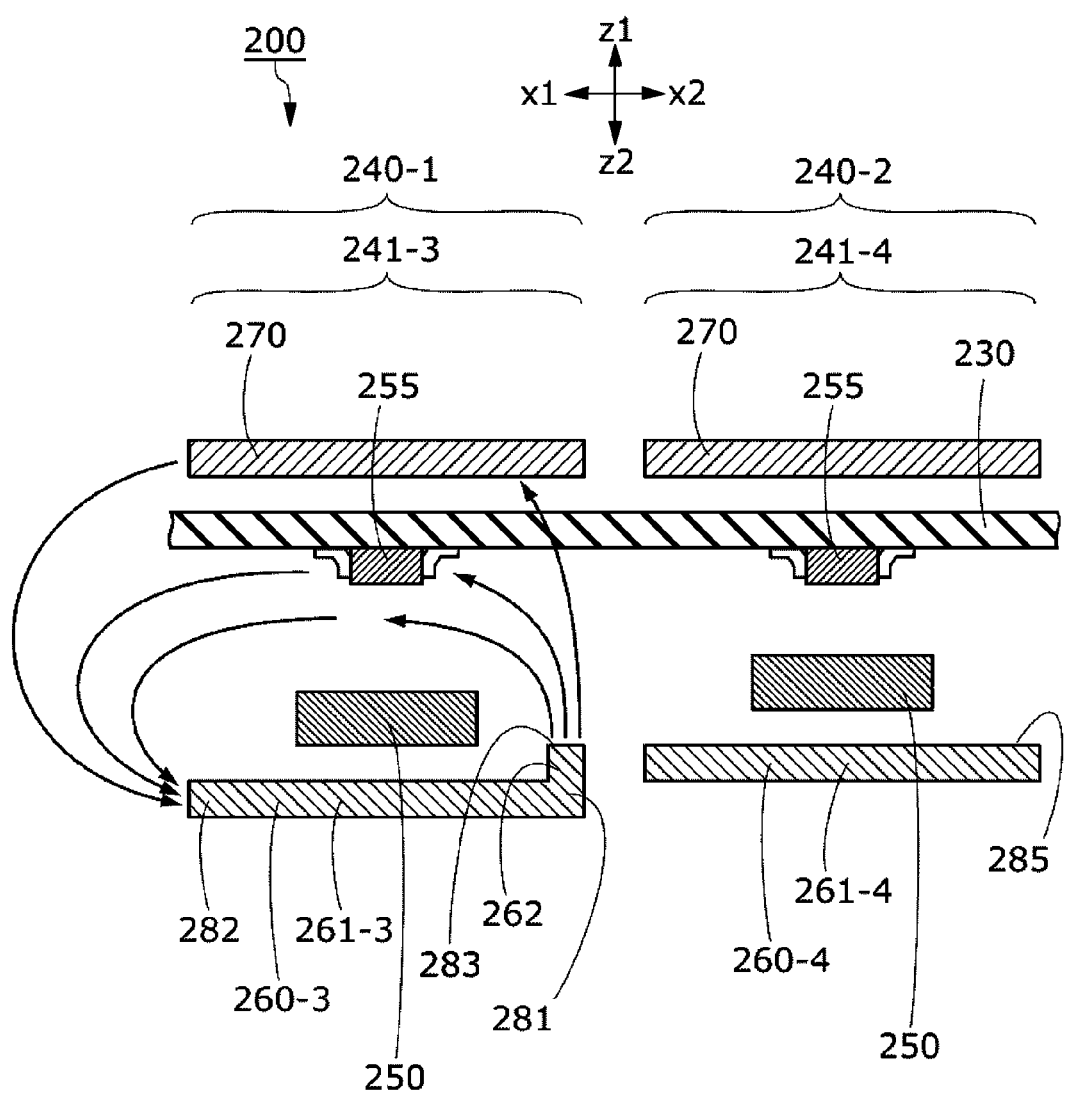
FIG. 3 is a partially enlarged cross-sectional view illustrating a magnetic flux generated from a current path in a third measurement unit in the second embodiment.

FIG. 3 is a partially enlarged cross-sectional view of the current sensor 200 in this embodiment in the vicinity of the third measurement unit 241-3 and fourth measurement unit 241-4 illustrated in FIG. 2.

In FIG. 3, a first case 210 and a second case 215 are omitted. As illustrated in FIG. 3, the plate-like part 261-3 in the third measurement unit 241-3 included in the large-current unit group 240-1 may have a first edge 281 close to the small-current unit group 240-2 in the x direction, and may also have a second edge 282 distant from the small-current unit group 240-2 in the x direction.

The first magnetic shield 260-3 in the third measurement unit 241-3 includes a first large-current protrusion 262 extending from the first edge 281 toward a second opposing part 216 (FIG. 2). At the cross section illustrated in FIG. 3, the first large-current protrusion 262 is substantially a rectangle that has two sides substantially parallel to the x direction and two sides substantially parallel to the z direction, and extends along the whole of the plate-like part 261 in the y direction.

A first tip 283, in the z direction, of the first large-current protrusion 262 on the same side as the second opposing part 216 (FIG. 2) (that is, on the z1 side) and one surface 285 of the plate-like part 261 in the small-current unit group 240-2, the one surface 285 being on the same side as the second opposing part 216 (FIG. 2) (that is, on the z1 side), may be positioned on substantially the same plane orthogonal to the z direction.

FIG. 3 further illustrates a magnetic flux generated by a current flowing in a current path 250 in the third measurement unit 241-3 in this embodiment in schematic form by arrows. In the third measurement unit 241-3, the magnetic flux passes through the first magnetic shield 260-3 from the second edge 282 in the x2 direction, passes through the first edge 281 in the plate-like part 261-3, and proceeds toward the first large-current protrusion 262.

As illustrated in FIG. 3, one part of the magnetic flux that has exited from the first large-current protrusion 262 in the z1 direction passes between the current path 250 and magneto-electric conversion element 255 in the third measurement unit 241-3, and returns to the second edge 282. Another part of the magnetic flux that has exited from the first large-current protrusion 262 in the z1 direction passes through the magneto-electric conversion element 255 in the third measurement unit 241-3 in the x1 direction, and returns to the second edge 282.

Another part of the magnetic flux that has exited from the first large-current protrusion 262 in the z1 direction enters the second magnetic shield 270 from the vicinity of the end of the second magnetic shield 270 in the third measurement unit 241-3 in the third measurement unit 241-3, the end being on the x2 side, passes through the second magnetic shield 270 in the x1 direction, and returns to the second edge 282 from the end of the second magnetic shield 270 on the x1 side.

Figure 4:
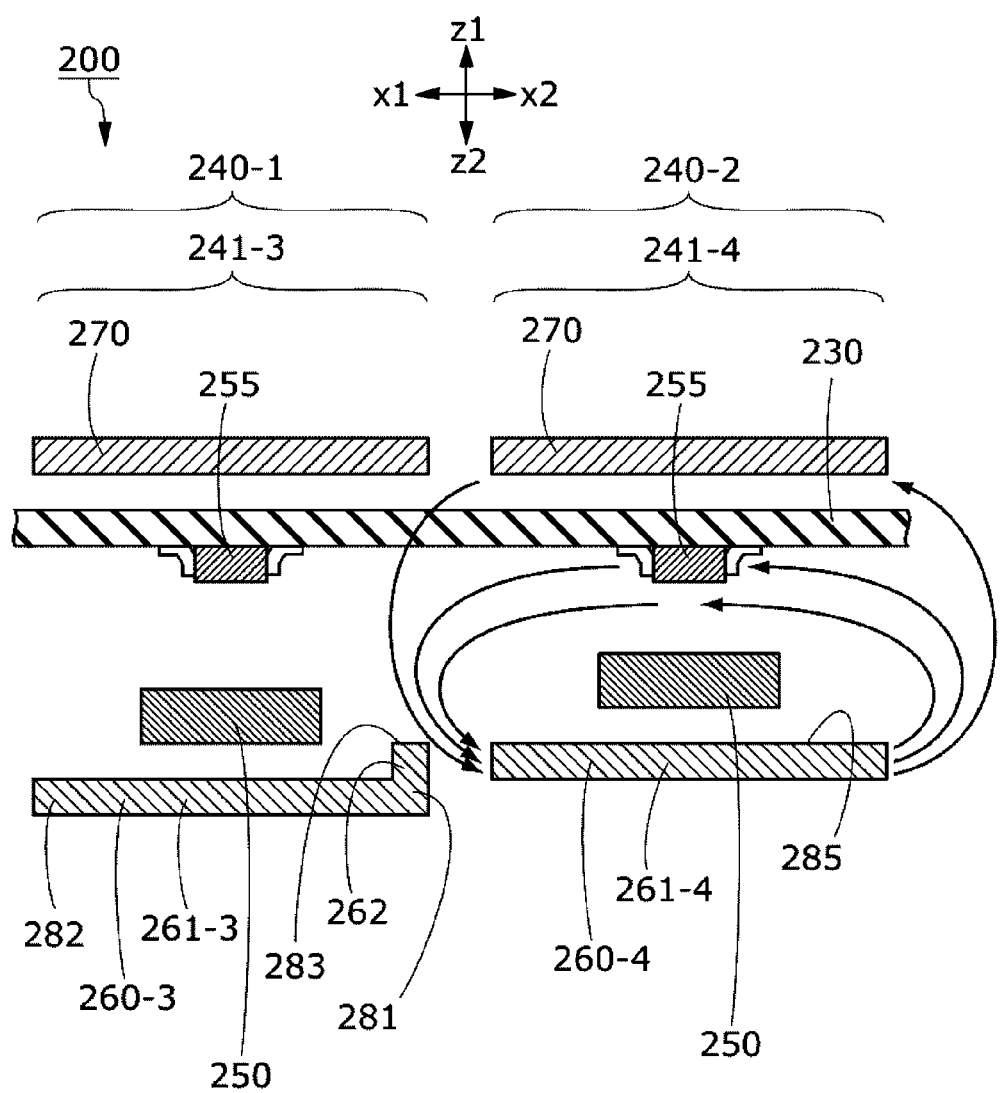
FIG. 4 is a partially enlarged cross-sectional illustrating a magnetic flux generated from a current path in a fourth measurement unit in the second embodiment.

FIG. 4 is a partially enlarged view of the current sensor 200 in this embodiment in the same range as in FIG. 3. FIG. 4 indicates another magnetic flux generated by a current flowing in the current path 250 in the fourth measurement unit 241-4 in this embodiment in schematic form by arrows. In the fourth measurement unit 241-4, the magnetic flux proceeds in the x2 direction from the end of the first magnetic shield 260-4 on the x1 side, and exits in the x2 direction from the end of the first magnetic shield 260-4 on the x2 side.

As illustrated in FIG. 4, one part of the magnetic flux that has exited from the end of the first magnetic shield 260-4 in the fourth measurement unit 241-4, the end being on the x2 side, passes between the current path 250 and magneto-electric conversion element 255 in the fourth measurement unit 241-4, and returns to the end of the first magnetic shield 260-4 on the x1 side. Another part of the magnetic flux that has exited from the end of the first magnetic shield 260-4 on the x2 side passes through the magneto-electric conversion element 255 in the fourth measurement unit 241-4 in the x1 direction, and returns to the end of the first magnetic shield 260-4 on the x1 side. Another part of the magnetic flux that has exited from the end of the first magnetic shield 260-4 enters the second magnetic shield 270 from the end of the second magnetic shield 270 in the fourth measurement unit 241-4, the end being on the x1 side, passes through the second magnetic shield 270 in the x1 direction, and returns to the end of the first magnetic shield 260-4 on the x1 side from the end of the second magnetic shield 270 on the x1 side.

Figure 5:
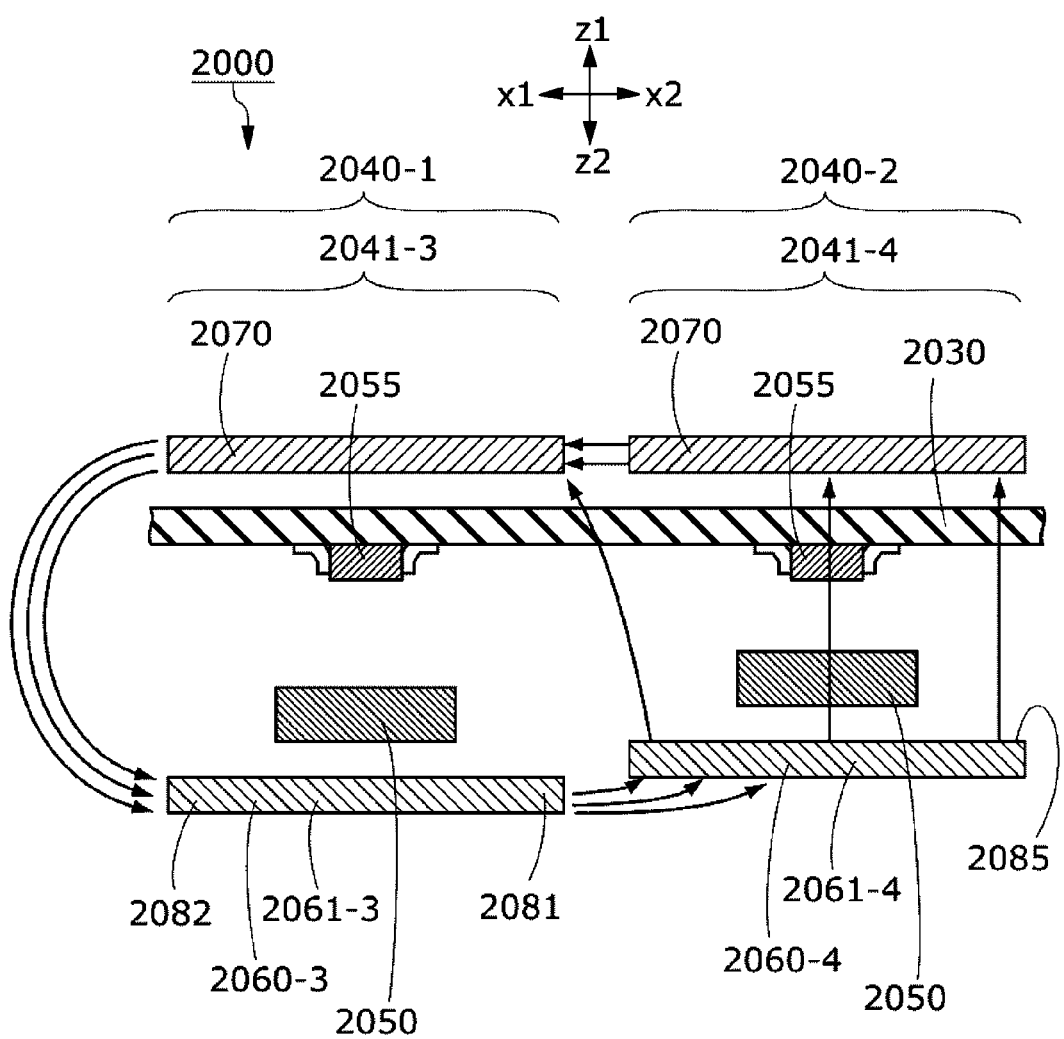
FIG. 5 is a partially enlarged cross-sectional illustrating a magnetic flux generated from a current path in a third measurement unit in a comparative example.

FIG. 5 is a partially enlarged view of a current sensor 2000 in a comparative example in the same range as in FIG. 3. For the current sensor 200, illustrated in FIG. 3, in this embodiment, the hundred's digit of the reference numeral of each constituent element is represented as 2. For the current sensor 2000, illustrated in FIG. 5, in the comparative example, the hundred's and higher digits of the reference numeral of each constituent element are represented as 20. Unless otherwise noted, constituent elements that differ only in the hundred's and higher digits are similar to each other. A first magnetic shield 2060-3 in a third measurement unit 2041-3 in the comparative example illustrated in FIG. 5 does not include the first large-current protrusion 262 (FIG. 3).

FIG. 5 further indicates a magnetic flux generated by a current flowing in a current path 2050 in the third measurement unit 2041-3 in the comparative example in schematic form by arrows. The magnetic flux that has exited from the end of the first magnetic shield 2060-3 in the third measurement unit 2041-3, the end being on the x2 side, enters a first magnetic shield 2060-4 in a first measurement unit 2041-4 from the surface of the first magnetic shield 2060-4 in the fourth measurement unit 2041-4, the surface being on the z2 side. The magnetic flux that has entered the first magnetic shield 2060-4 in the fourth measurement unit 2041-4 exits in the z1 direction from the whole of one surface of the first magnetic shield 2060-4 in the fourth mmu2041-4 on the z1 side.

As illustrated in FIG. 5, one part of the magnetic flux that has exited from the first magnetic shield 2060-4 in the fourth measurement unit 2041-4 enters the end of the second magnetic shield 2070 in the third measurement unit 2041-3, the end being on the x2 side, and another part enters the second magnetic shield 2070 in the fourth measurement unit 2041-4. The magnetic flux that has entered the second magnetic shield 2070 in the fourth measurement unit 2041-4 enters the end of the second magnetic shield 2070 in the third measurement unit 2041-3, the end being on the x2 side, from the end of the second magnetic shield 2070 in the fourth measurement unit 2041-4, the end being on the x1 side. The magnetic flux that has entered the second magnetic shield 2070 in the third measurement unit 2041-3 exits in the first direction from the end of the second magnetic shield 2070 in the third measurement unit 2041-3, the end being on the x1 side, and returns to the end of the first magnetic shield 2060-3 in the third measurement unit 2041-3, the end being on the x1 side.

A magnetic flux generated by a current flowing in the current path 2050 in the fourth measurement unit 2041-4 in the comparative example flows as in this embodiment indicated in FIG. 4.

As seen from FIG. 5, in the comparative example, which does not include the first large-current protrusion 262 (FIG. 3), the magnetic flux generated by the current path 2050 in the third measurement unit 2041-3 expands to the fourth measurement unit 2041-4, so sensitivity is lowered in a magneto-electric conversion element 2055 in the third measurement unit 2041-3. However, as seen from FIG. 3, in this embodiment that includes the first large-current protrusion 262, the magnetic flux generated by the current path 250 in the third measurement unit 241-3 is less likely to expand to the fourth measurement unit 241-4, so sensitivity in the magneto-electric conversion element 255 in the third measurement unit 241-3 can be maintained.

As illustrated in FIG. 4, even if the first large-current protrusion 262 is present, the magnetic field in the fourth measurement unit 241-4 does not largely change. Therefore, a difference in sensitivity among the measurement units 241 in the small-current unit group 240-2 can be kept small regardless of whether there is the first large-current protrusion 262.

To prevent an induced magnetic field intended to be measured by the small-current unit group 240-2 itself illustrated in FIG. 3 from being interfered, it is preferable for the first tip 283 of the first large-current protrusion 262 to be at the same position in the z direction as the one surface 285 of the plate-like part 261 in the small-current unit group 240-2 or to be positioned more on the z2 side than is the one surface 285. In consideration of a balance between improving sensitivity in the large-current unit group 240-1 and maintaining sensitivity in the small-current unit group 240-2, it is preferable for the first tip 283 of the first large-current protrusion 262 and the one surface 285 of the plate-like part 261 in the small-current unit group 240-2 to be positioned on substantially the same planes orthogonal to the z direction.

Conclusion

According to this embodiment, effects similar to the effects in the first embodiment are obtained except for differences.

According to this embodiment: one of the plurality of unit groups 240 may be the large-current unit group 240-1; another one of the plurality of unit groups 240 may be the small-current unit group 240-2, which measures an induced magnetic field caused by a smaller current than in the large-current unit group 240-1; the large-current unit group 240-1 and small-current unit group 240-2 may be adjacent to each other; all first magnetic shields 260 may include the plate-like part 261 expanding along a plane including the second direction; all plate-like parts 261 may be included in the large-current unit group 240-1 expand along substantially the same planes; all plate-like parts 261 included in the small-current unit group 240-2 may expand along substantially the same planes; the current path 250 and second magnetic shield 270 that are included in the measurement unit 241 shared between them may be positioned so as to be separated by the fourth distance in the first direction; the fourth distance in the large-current unit group 240-1 may be longer than the fourth distance in the small-current unit group 240-2; the first magnetic shield 260 and second magnetic shield 270 that are included in the measurement unit 241 shared between them may be positioned so as to be separated by the fifth distance in the first direction; the fifth distance in the large-current unit group 240-1 may be longer than the fifth distance in the small-current unit group 240-2;

the plate-like part 261 included in the large-current unit group 240-1 may have the first edge 281 close to the small-current unit group 240-2 in the second direction, and may also have the second edge 282 distant from the small-current unit group 240-2 in the second direction; and of all first magnetic shields 260 included in the large-current unit group 240-1, one or more first magnetic shields 260 including the first magnetic shield 260 closest to the small-current unit group 240-2 may have the first large-current protrusion 262 extending from the first edge 281 toward the second opposing part 216. Therefore, it is possible to prevent undesired diffusion of an induced magnetic field directed from the large-current unit group 240-1 toward the small-current unit group 240-2.

A specific description will be given. When the first magnetic shield 260 closest to the small-current unit group 240-2 in the large-current unit group 240-1 and the first magnetic shield 260 closest to the large-current unit group 240-1 in the small-current unit group 240-2 are viewed in the first direction, the first magnetic shield 260 in the large-current unit group 240-1 is positioned more distant from the second opposing part 216 than is the first magnetic shield 260 in the small-current unit group 240-2. Therefore, if there is no first large-current protrusion 262, most of the induced magnetic field diffuses from the edge of the plate-like part 261 of the first magnetic shield 260 in the large-current unit group 240-1, the edge being on the same side as the small-current unit group 240-2, to the first magnetic shield 260 in the small-current unit group 240-2. As a result, if there is no first large-current protrusion 262, sensitivity is lowered in the measurement unit 241 closest to the small-current unit group 240-2 in the large-current unit group 240-1. Since there is the first large-current protrusion 262, however, most of the induced magnetic field is directed from the edge of the plate-like part 261 of the first magnetic shield 260 in the large-current unit group 240-1, the edge being on the same side as the small-current unit group 240-2, through the first large-current protrusion 262 toward the second opposing part 216. As a result, it is possible to prevent undesired diffusion of an induced magnetic field directed from the large-current unit group 240-1 toward the small-current unit group 240-2.

According to this embodiment, since the first tip 283, in the first direction, of the first large-current protrusion 262 on the same side as the second opposing part 216 and the one surface 285 of the plate-like part 261 of the first magnetic shield 260 in the small-current unit group 240-2, the one surface 285 being on the same side as the second opposing part 216, may be positioned on substantially the same planes orthogonal to the first direction, it is possible to minimize diffusion of an induced magnetic field directed from the large-current unit group 240-1 toward the small-current unit group 240-2 and diffusion of an induced magnetic field directed from the small-current unit group 240-2 toward the large-current unit group 240-1 and thereby to equalize sensitivity in the measurement units 241 adjacent to the boundary between the large-current unit group 240-1 and the small-current unit group 240-2 to sensitivity in other measurement units 241.

Third Embodiment

Figure 6:
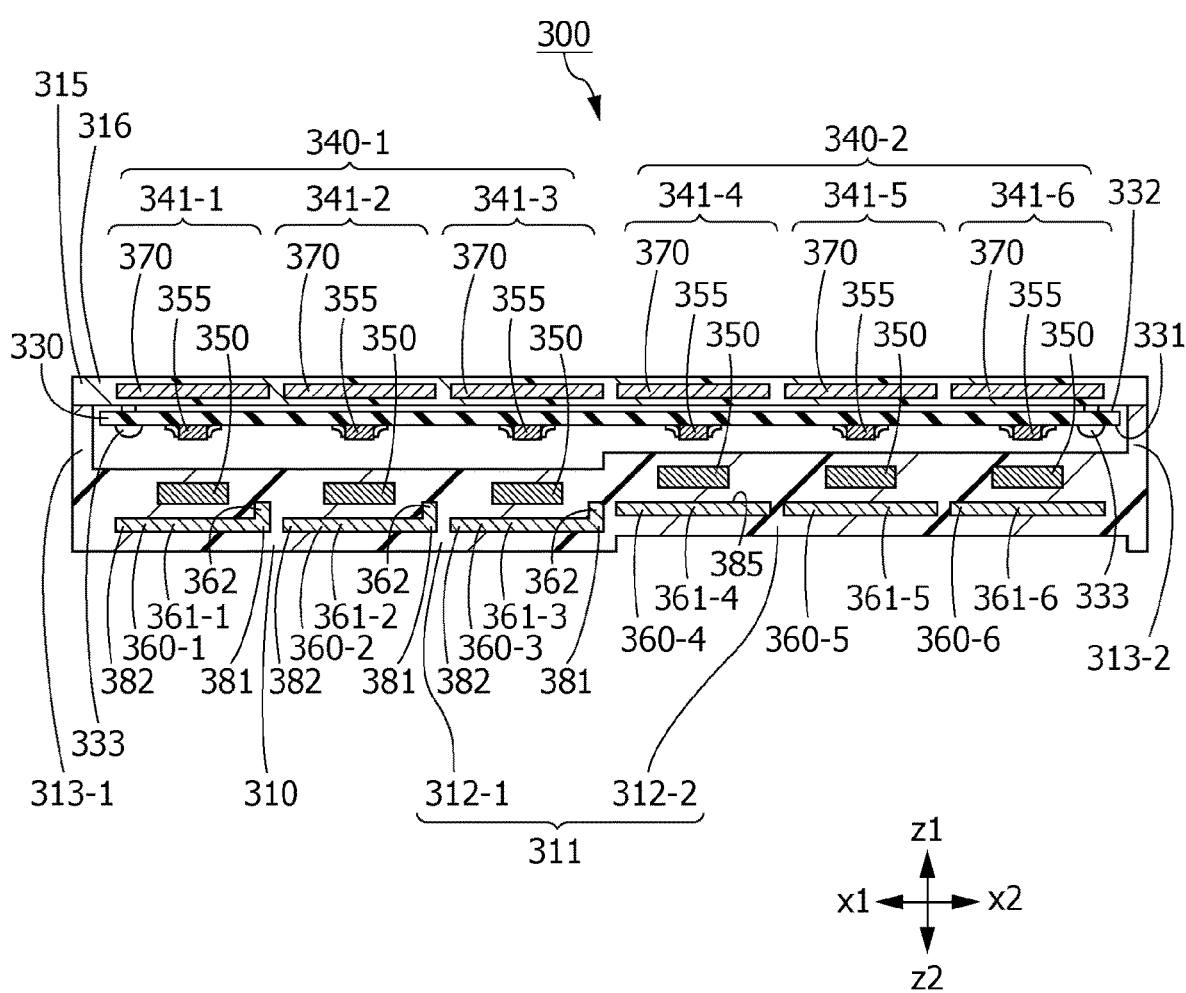
FIG. 6 is a cross-sectional view of a current sensor in a third embodiment.

Next, a current sensor in a third embodiment will be described. FIG. 6 is a cross-sectional view of the current sensor 300 in this embodiment at a cross section parallel to a zx plane. Differences between the current sensor 200 (FIG. 2) in the second embodiment and the current sensor 300 in this embodiment will be mainly described below. For the current sensor 200, illustrated in FIG. 2, in the second embodiment, the hundred's digit of the reference numeral of each constituent element is represented as 2. For the current sensor 300, illustrated in FIG. 6, in this embodiment, the hundred's digit of the reference numeral of each constituent element is represented as 3. Unless otherwise noted, constituent elements that differ only in the hundred's digit are similar to each other.

The shapes of all first magnetic shields 360 included in a large-current unit group 340-1 may be substantially the same. That is, all first magnetic shields 360 included in the large-current unit group 340-1 in this embodiment may be the same as the first magnetic shield 260-3 included in the third measurement unit 241-3 in the second embodiment (FIG. 2). As illustrated in FIG. 6, each of a first measurement unit 341-1 to a third measurement unit 341-3 includes a first large-current protrusion 362.

Conclusion

According to this embodiment, effects similar to the effects in the second embodiment are obtained except for differences.

According to this embodiment, the shapes of all first magnetic shields 360 included in the large-current unit group 340-1 may be substantially the same, so a design is made easy with a difference in sensitivity suppressed among the measurement units 341 included in the large-current unit group 340-1. Also, manufacturing and management costs can be suppressed by using common parts.

Fourth Embodiment

Figure 7:
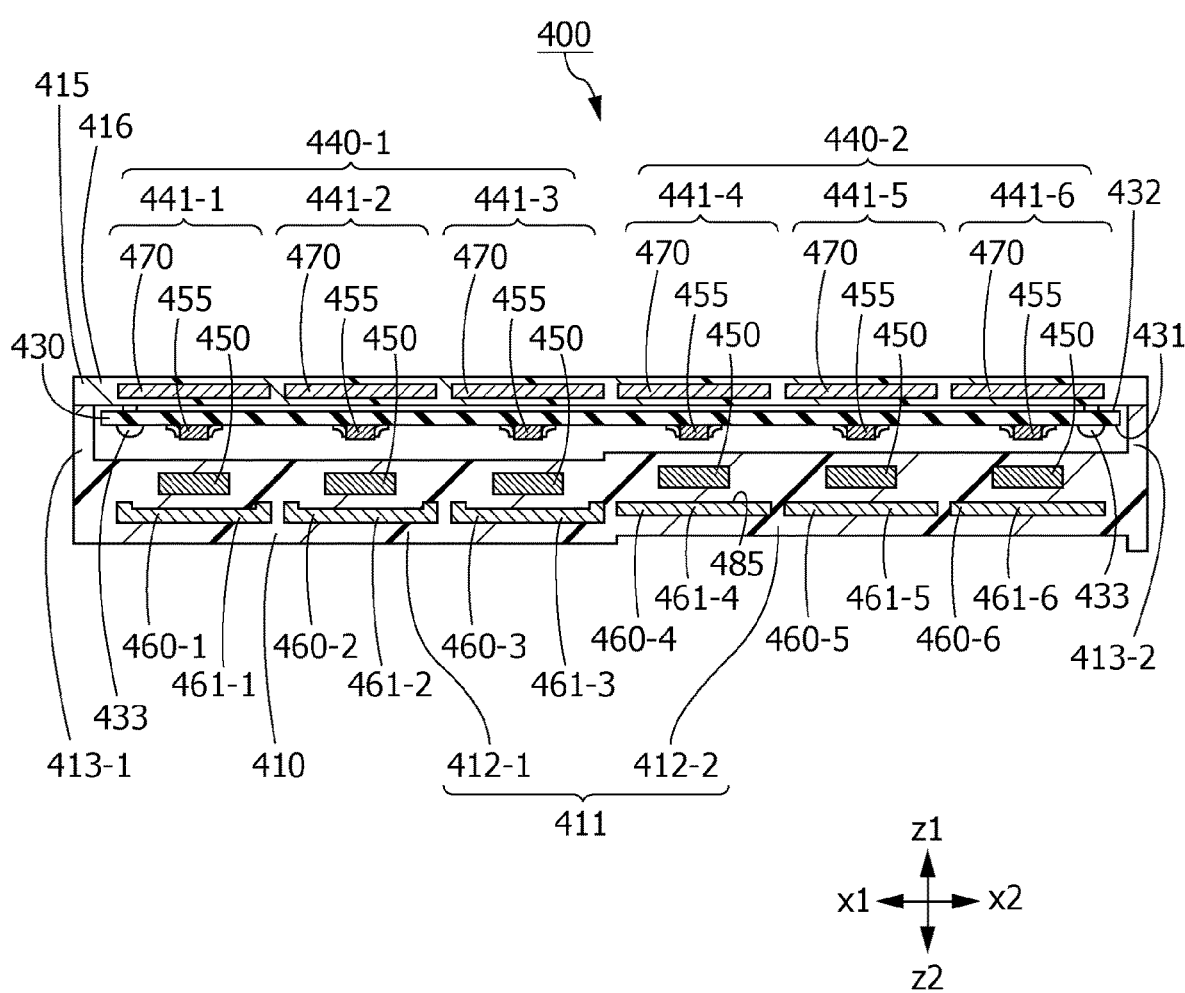
FIG. 7 is a cross-sectional view of a current sensor in a fourth embodiment.

Next, a current sensor in a fourth embodiment will be described. FIG. 7 is a cross-sectional view of the current sensor 400 in this embodiment at a cross section parallel to a zx plane. Differences between the current sensor 300 (FIG. 6) in the third embodiment and the current sensor 400 in this embodiment will be mainly described below. For the current sensor 300, illustrated in FIG. 6, in the third embodiment, the hundred's digit of the reference numeral of each constituent element is represented as 3. For the current sensor 400, illustrated in FIG. 7, in this embodiment, the hundred's digit of the reference numeral of each constituent element is represented as 4. Unless otherwise noted, constituent elements that differ only in the hundred's digit are similar to each other.

Figure 8:
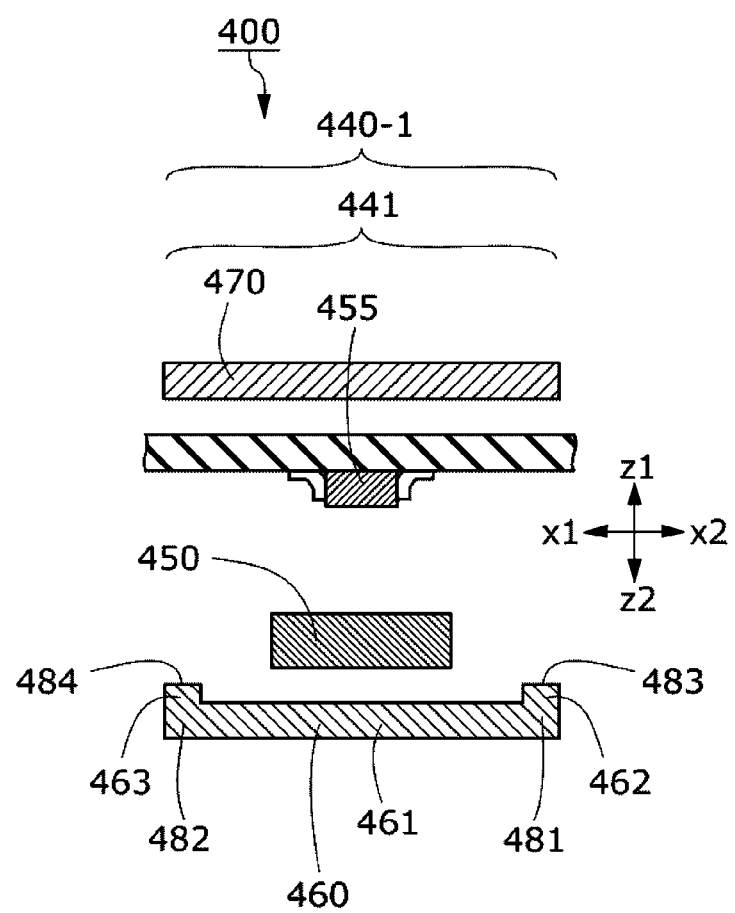
FIG. 8 is a partially enlarged cross-sectional view of the current sensor in the fourth embodiment.

The shapes of all first magnetic shields 460 included in a large-current unit group 440-1 may be substantially the same. FIG. 8 is a partially enlarged cross-sectional view of a substrate 430 and one measurement unit 441 included in the large-current unit group 440-1 illustrated in FIG. 7.

As illustrated in FIG. 8, besides a first large-current protrusion 462 as in the third embodiment, the first magnetic shield 460 in the large-current unit group 440-1 may include a second large-current protrusion 463 extending from a second edge 482 toward a second opposing part 416 (FIG. 7). That is, each of the first magnetic shields 460 (FIG. 7) including the first large-current protrusion 462 (FIG. 8) may have the second large-current protrusion 463 (FIG. 8). At the cross section illustrated in FIG. 8, the second large-current protrusion 463 is substantially a rectangle that has two sides substantially parallel to the x direction and two sides substantially parallel to the z direction, and extends along the whole of a plate-like part 461 in the y direction.

The first magnetic shield 460 has a dyadic symmetric shape, which coincides when rotated 180 degrees around an axis extending in the z direction. That is, when the first large-current protrusion 462 is rotated 180 degrees, it coincides with the second large-current protrusion 463. A first tip 483 of the first large-current protrusion 462 on the z1 side in the z direction, a second tip 484 of the second large-current protrusion 463 on the z1 side in the z direction, and one surface 485 of the first magnetic shield 460, included in the small-current unit group 440-2 illustrated in FIG. 7, on the z1 side may be positioned on substantially the same planes orthogonal to the z direction.

Also to prevent saturation of a magneto-electric conversion element 455, the distance between the current path 450 and magneto-electric conversion element 455 in the large-current unit group 440-1 illustrated in FIG. 7 is generally made longer than the distance between the current path 450 and magneto-electric conversion element 455 in the small-current unit group 440-2. In this embodiment, however, since the first magnetic shield 460 in the large-current unit group 440-1 includes both the first large-current protrusion 462 and the second large-current protrusion 463, the magnetic flux directed from the first magnetic shield 460 toward the second magnetic shield 470 is increased. As a result, the magnetic flux passing through the magneto-electric conversion element 455 is reduced.

Since, in this embodiment, the magnetic flux passing through the magneto-electric conversion element 455 is reduced when compared with when there is no second large-current protrusion 463, the distance between the current path 450 and magneto-electric conversion element 455 in the large-current unit group 440-1 can be made to approach the distance between the current path 450 and magneto-electric conversion element 455 in the small-current unit group 440-2. As a result, it is possible to reduce a shift between a left first sub-opposing part 412-1 and a right first sub-opposing part 412-2 and to increase the strength of a first case 410.

Conclusion

According to this embodiment, effects similar to the effects in the third embodiment are obtained except for differences.

According to this embodiment, each of one or more first magnetic shields 460 including the first large-current protrusion 462 may have the second large-current protrusion 463 extending from the second edge 482 toward the second opposing part 416, so the first magnetic shields 460 can be easily oriented in the same direction during manufacturing due to both the first large-current protrusion 462, and the second large-current protrusion 463, and the structures of part supplying portions in a manufacturing apparatus can be simplified.

Fifth Embodiment

Figure 9:
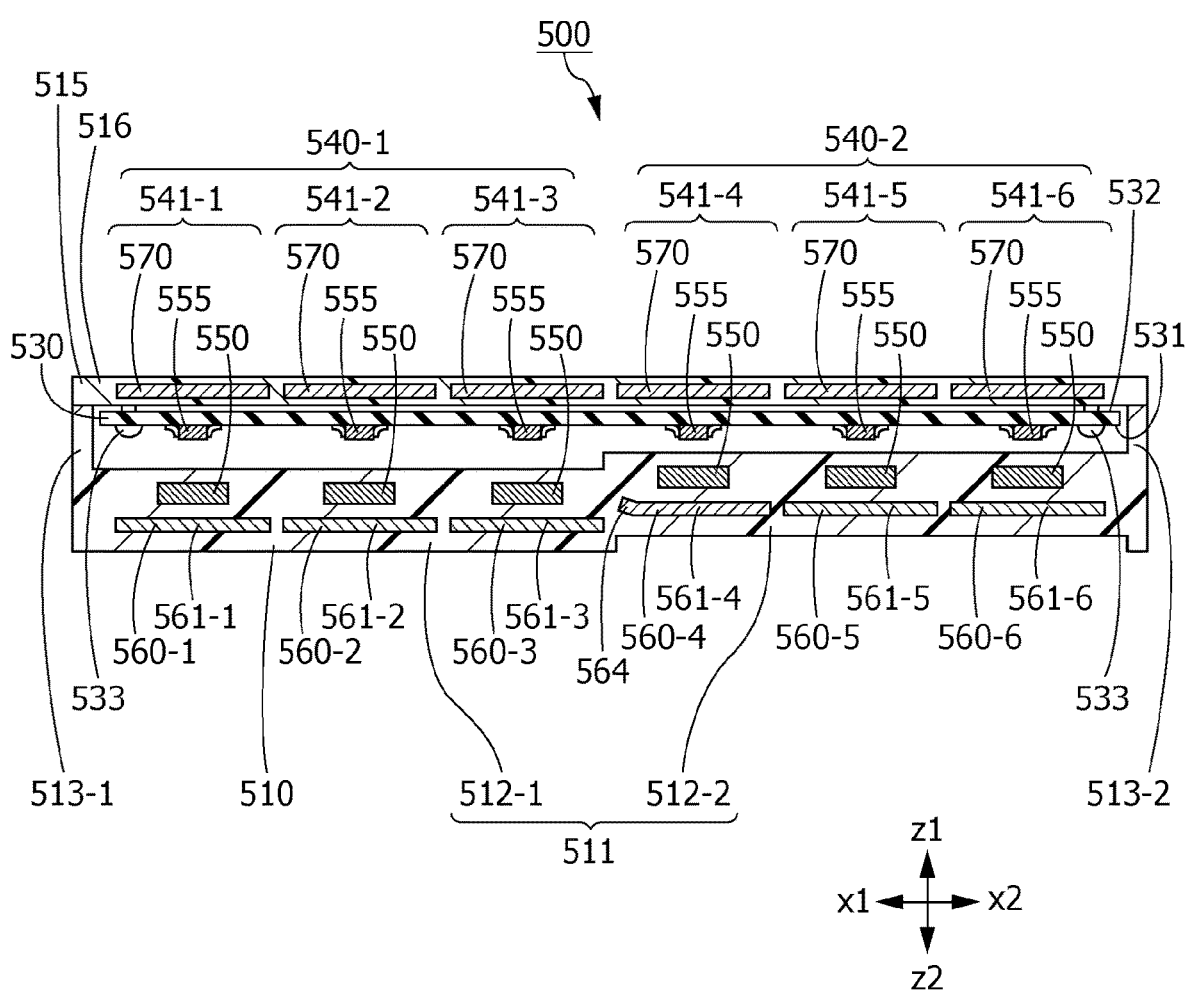
FIG. 9 is a cross-sectional view of a current sensor in a fifth embodiment.

Next, a current sensor in a fifth embodiment will be described. FIG. 9 is a cross-sectional view of the current sensor 500 in this embodiment at a cross section parallel to a zx plane. Differences between the current sensor 100 (FIG. 1) in the first embodiment and the current sensor 500 in this embodiment will be mainly described below. For the current sensor 100, illustrated in FIG. 1, in the first embodiment, the hundred's digit of the reference numeral of each constituent element is represented as 1. For the current sensor 500, illustrated in FIG. 9, in this embodiment, the hundred's digit of the reference numeral of each constituent element is represented as 5. Unless otherwise noted, constituent elements that differ only in the hundred's digit are similar to each other.

First magnetic shields 560 in a first measurement unit 541-1 to a sixth measurement unit 541-6 respectively include plate-like parts 561-1 to 561-6 (sometimes referred to below as plate-like parts 561 without distinguishing between them). Each plate-like part 561 has substantially the same shape as the first magnetic shield 160 in the first embodiment. All first magnetic shields 560 have the plate-like part 561, which expands along a plane substantially orthogonal to the z direction.

All plate-like parts 561 included in a large-current unit group 540-1 expand along substantially the same planes. All plate-like parts 561 included in a small-current unit group 540-2 expand along substantially the same planes. However, the width of the plate-like part 561 included in the small-current unit group 540-2 in the x direction is slightly smaller than the width of the plate-like part 561 included in the large-current unit group 540-1 in the x direction.

Figure 10:
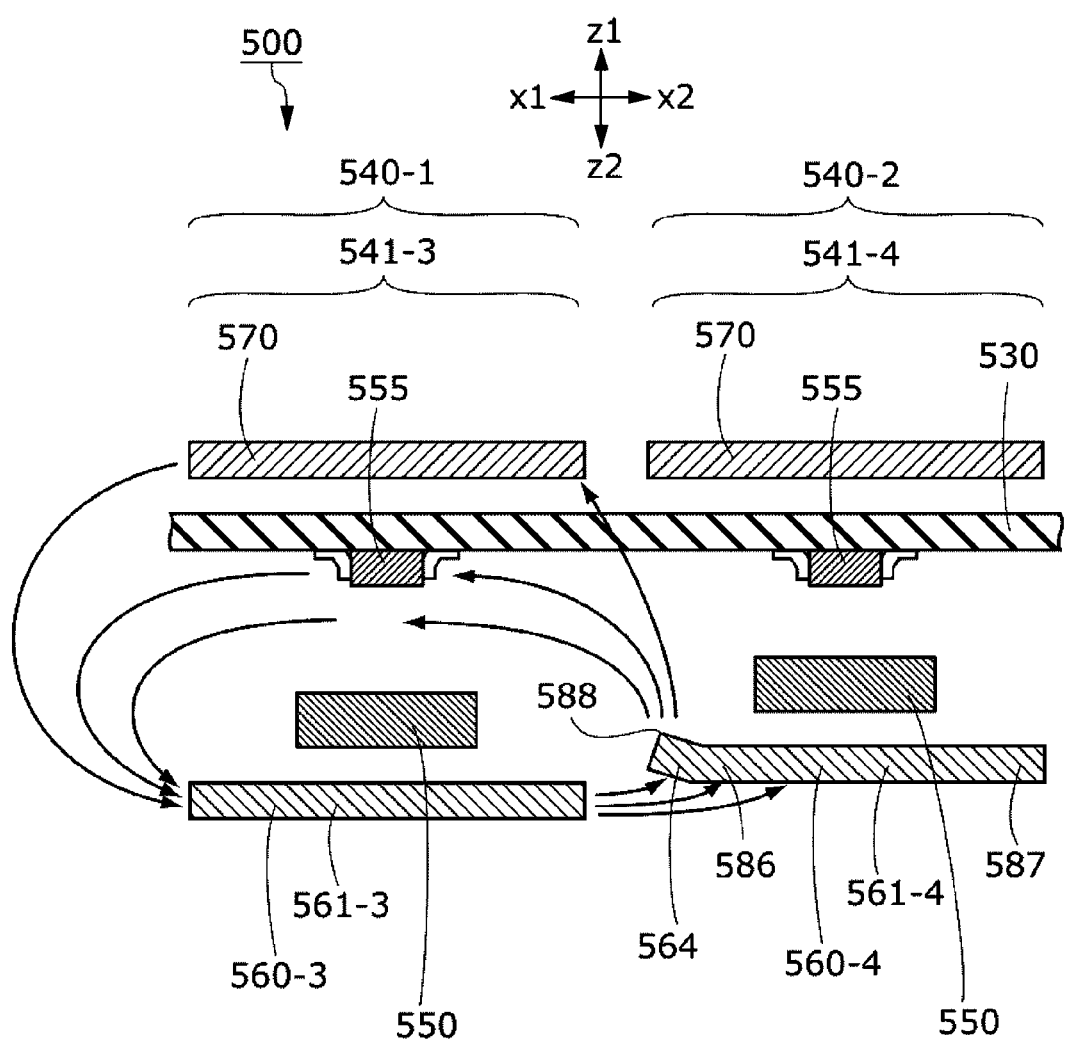
FIG. 10 is a partially enlarged cross-sectional illustrating a magnetic flux generated from a current path in a third measurement unit in the fifth embodiment.

FIG. 10 is a partially enlarged cross-sectional view of the current sensor 500 in this embodiment in the vicinity of the third measurement unit 541-3 and fourth measurement unit 541-4 illustrated in FIG. 9. In FIG. 10, a first case 510 and a second case 515 are omitted. As illustrated in FIG. 10, the plate-like part 561-4 in the fourth measurement unit 541-4 included in the small-current unit group 540-2 may have a first edge 586 close to the large-current unit group 540-1 in the x direction, and may also have a second edge 587 distant from the large-current unit group 540-1 in the x direction.

The first magnetic shield 560-4 in the fourth measurement unit 541-4 may include a first small-current protrusion 564 extending from the first edge 586 toward a second opposing part 516 (FIG. 9). At the cross section illustrated in FIG. 10, the first small-current protrusion 564 extends in a direction between the z1 direction and the x1 direction. At the cross section illustrated in FIG. 10, the first magnetic shield 560-4 and first small-current protrusion 564 may form an obtuse angle. In the fourth measurement unit 541-4, the width of the whole of the first magnetic shield 560-4 in the x direction is substantially the same as the width of a second magnetic shield 570 in the x direction. The first small-current protrusion 564 extends along the whole of the plate-like part 561-4 in the y direction.

In the fourth measurement unit 541-4 including the first small-current protrusion 564, a first tip 588 of the first small-current protrusion 564 on the same side as the second opposing part 516 (FIG. 9) (that is, on the z1 side) in the z direction may be at a position more distant from the second opposing part 516 (FIG. 9) (that is, on the z2 side) than from the center of the current path 550 in the z direction.

FIG. 10 further illustrates a magnetic flux generated by a current flowing in a current path 550 in the third measurement unit 541-3 in this embodiment in schematic form by arrows. The magnetic flux that has entered the first magnetic shield 560-3 in the third measurement unit 541-3 from the end of the first magnetic shield 560-3 on the x1 side exits from the end of the first magnetic shield 560-3 on the x2 side in the x2 direction, and enters the first magnetic shield 560-4 in the fourth measurement unit 541-4 from the surface on the z2 side. The magnetic flux that has entered the first magnetic shield 560-4 in the fourth measurement unit 541-4 exits from the first small-current protrusion 564 in the z1 direction.

As illustrated in FIG. 10, one part of the magnetic flux that has exited from the first small-current protrusion 564 passes between the current path 550 and magneto-electric conversion element 555 in the third measurement unit 541-3, and returns to the end of the first magnetic shield 560-3 in the third measurement unit 541-3, the end being on the x1 side.

Another part of the magnetic flux that has exited from the first small-current protrusion 564 passes through the magneto-electric conversion element 555 in the x1 direction in the third measurement unit 541-3, and returns to the end of the first magnetic shield 560-3 on the x1 side. Another part of the magnetic flux that has exited from the first small-current protrusion 564 enters the second magnetic shield 570 from the vicinity of the end of the second magnetic shield 570 in the third measurement unit 541-3, the end being on the x2 side, passes through the second magnetic shield 570 in the x1 direction, and returns to the end of the first magnetic shield 560-3 on the x1 side from the end of the second magnetic shield 570 on the x1 side.

Figure 11:
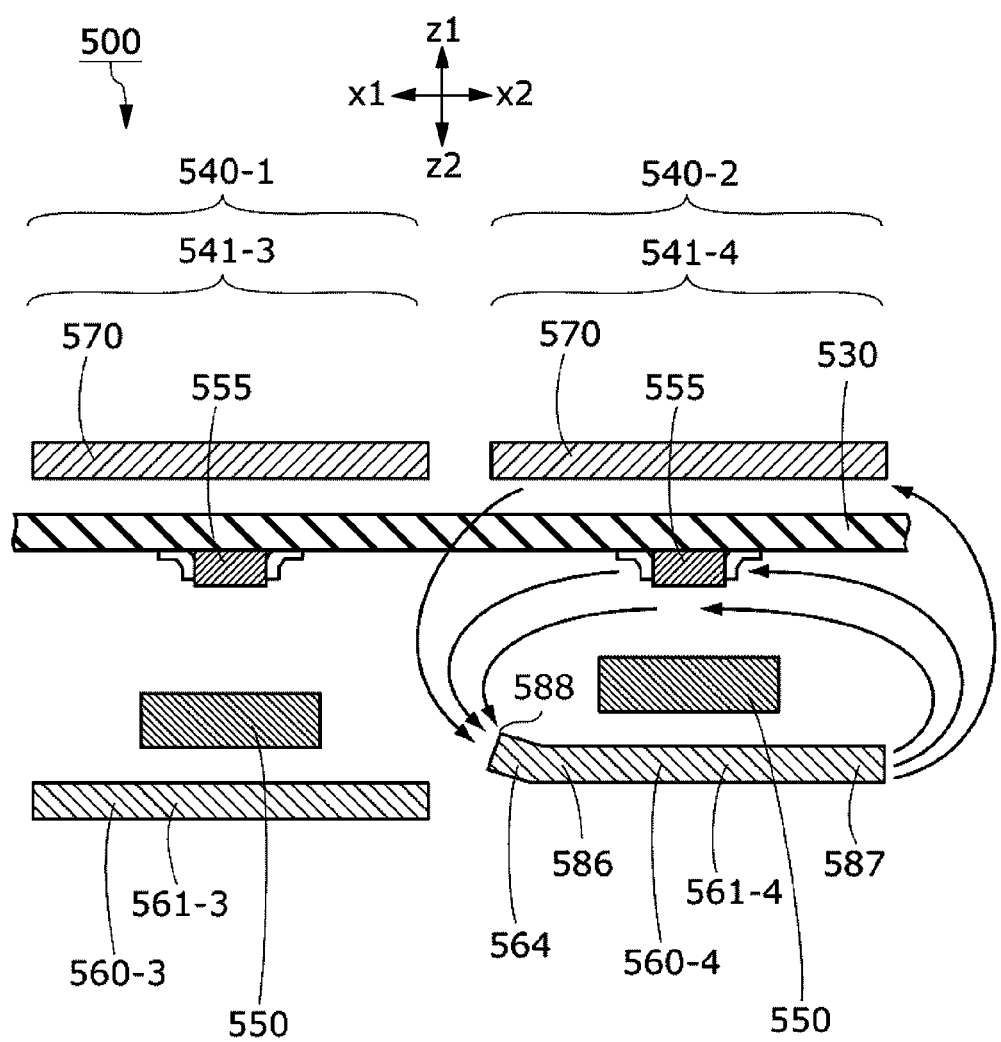
FIG. 11 is a partially enlarged cross-sectional illustrating a magnetic flux generated from a current path in a fourth measurement unit in the fifth embodiment.

FIG. 11 is a partially enlarged view of the current sensor 500 in this embodiment in the same range as in FIG. 10. FIG. 11 further indicates a magnetic flux generated by a current flowing in the current path 550 in the fourth measurement unit 541-4 in this embodiment in schematic form by arrows. In the fourth measurement unit 541-4, the magnetic flux proceeds in the x2 direction from the end of the first magnetic shield 560-4 on the x1 side, and exits in the x2 direction from the end of the first magnetic shield 560-4 on the x2 side.

As illustrated in FIG. 11, one part of the magnetic flux that has exited from the first magnetic shield 560-4 passes between the current path 550 and magneto-electric conversion element 555 in the fourth measurement unit 541-4, and returns to the first small-current protrusion 564. Another part of the magnetic flux that has exited from the first magnetic shield 560-4 passes through the magneto-electric conversion element 555 in the fourth measurement unit 541-4 in the x1 direction, and returns to the first small-current protrusion 564. Another part of the magnetic flux that has exited from the first magnetic shield 560-4 enters the second magnetic shield 570 in the fourth measurement unit 541-4 from the end of the second magnetic shield 570 ion the x2 side, passes through the second magnetic shield 570 in the x1 direction, and returns to the first small-current protrusion 564 from the end of the second magnetic shield 570 on the x1 side.

As described in the second embodiment with reference to FIG. 5, in the comparative example, which does not include the first small-current protrusion 564 (FIG. 10), the magnetic flux generated by the current path 2050 in the third measurement unit 2041-3 expands to the fourth measurement unit 2041-4, so sensitivity is lowered in the magneto-electric conversion element 2055 in the third measurement unit 2041-3. However, as seen from FIG. 10, in this embodiment that includes the first small-current protrusion 564, the magnetic flux generated by the current path 550 in the third measurement unit 541-3 is less likely to expand to the fourth measurement unit 541-4, so sensitivity in the magneto-electric conversion element 555 in the third measurement unit 541-3 can be maintained.

As illustrated in FIG. 11, even if the first small-current protrusion 564 is present, the magnetic field in the fourth measurement unit 541-4 does not largely change. Therefore, a difference in sensitivity among sensitivity among the measurement units 541 in the small-current unit group 540-2 can be kept small regardless of whether there is the first small-current protrusion 564.

Conclusion

According to this embodiment, effects similar to the effects in the first embodiment are obtained except for differences.

According to this embodiment: one of the plurality of unit groups 540 may be the large-current unit group 540-1; another one of the plurality of unit groups 540 may be the small-current unit group 540-2; the large-current unit group 540-1 and small-current unit group 540-2 may be adjacent to each other; all first magnetic shields 560 may include the plate-like part 561 expanding along a plane including the second direction; all plate-like parts 561 included in the large-current unit group 540-1 may expand along substantially the same planes; all plate-like parts 561 included in the small-current unit group 540-2 may expand along substantially the same planes; the current path 550 and second magnetic shield 570 that are included in the measurement unit 541 shared between them may be positioned so as to be separated by the fourth distance in the first direction; the fourth distance in the large-current unit group 540-1 may be longer than the fourth distance in the small-current unit group 540-2; the first magnetic shield 560 and second magnetic shield 570 that are included in the measurement unit 541 shared between them may be positioned so as to be separated by the fifth distance in the first direction; the fifth distance in the large-current unit group 540-1 may be longer than the fifth distance in the small-current unit group 540-2; the plate-like part 561 included in the small-current unit group 540-2 may have the first edge 586 close to the large-current unit group 540-1 in the second direction, and may also have the second edge 587 distant from the large-current unit group 540-1 in the second direction; and of all first magnetic shields 560 included in the small-current unit group 540-2, one or more first magnetic shields 560 including the first magnetic shield 560 closest to the large-current unit group 540-1 may have the first small-current protrusion 564 extending from the first edge 586 toward the second opposing part 516. Therefore, it is possible to prevent undesired diffusion of an induced magnetic field directed from the large-current unit group 540-1 toward the small-current unit group 540-2.

A specific description will be given. When the first magnetic shield 560 closest to the small-current unit group 540-2 in the large-current unit group 540-1 and the first magnetic shield 560 closest to the large-current unit group 540-1 in the small-current unit group 540-2 are viewed in the first direction, the first magnetic shield 560 in the large-current unit group 540-1 is positioned more distant from the second opposing part 516 than is the first magnetic shield 560 in the small-current unit group 540-2. Therefore, if there is no first small-current protrusion 564, most of the induced magnetic field diffuses from the edge of the plate-like part 561 of the first magnetic shield 560 in the large-current unit group 540-1, the edge being on the same side as the small-current unit group 540-2, to the small-current unit group 540-2. As a result, if there is no first small-current protrusion 564, sensitivity is lowered in the measurement unit 541 closest to the small-current unit group 540-2 in the large-current unit group 540-1. Since there is the first small-current protrusion 564, however, most of the induced magnetic field that has diffused to the first magnetic shield 560 in the small-current unit group 540-2 is directed from the edge of the plate-like part 561-3 of the first magnetic shield 560 in the large-current unit group 540-1, the edge being on the same side as the small-current unit group 540-2, through the first small-current protrusion 564 toward the second opposing part 516, making the magnetic field likely to return to the large-current unit group 540-1. As a result, it is possible to prevent undesired diffusion of an induced magnetic field directed from the large-current unit group 540-1 toward the small-current unit group 540-2.

The induced magnetic field intended to be measured in the small-current unit group 540-2 also concentrates in the first small-current protrusion 564. However, since the induced magnetic field intended to be measured in the small-current unit group 540-2 concentrates on an end of the first magnetic shield 560 regardless of whether there is the first small-current protrusion 564, sensitivity in the small-current unit group 540-2 is less likely to be affected by whether there is the first small-current protrusion 564. To reduce a difference in sensitivity among the measurement units 541 included in the small-current unit group 540-2, however, it is preferable to reduce the amount of protrusion of the first small-current protrusion 564 in the first direction. The amount of protrusion of the first small-current protrusion 564 is preferably about the first distance, which is the distance between the current path 550 and the first magnetic shield 560.

According to this embodiment, in the measurement unit 541 including the first small-current protrusion 564, the first tip 588 of the first small-current protrusion 564 in the first direction, the first tip 588 being on the same side as the second opposing part 516, may be at a position more distant from the second opposing part 516 than from the center of the current path 550 in the first direction, and the first magnetic shield 560 and first small-current protrusion 564 may form an obtuse angle, the effect of a difference in sensitivity in the small-current unit group 540-2, the effect being caused by providing the first small-current protrusion 564, can be suppressed.

Sixth Embodiment

Figure 12:
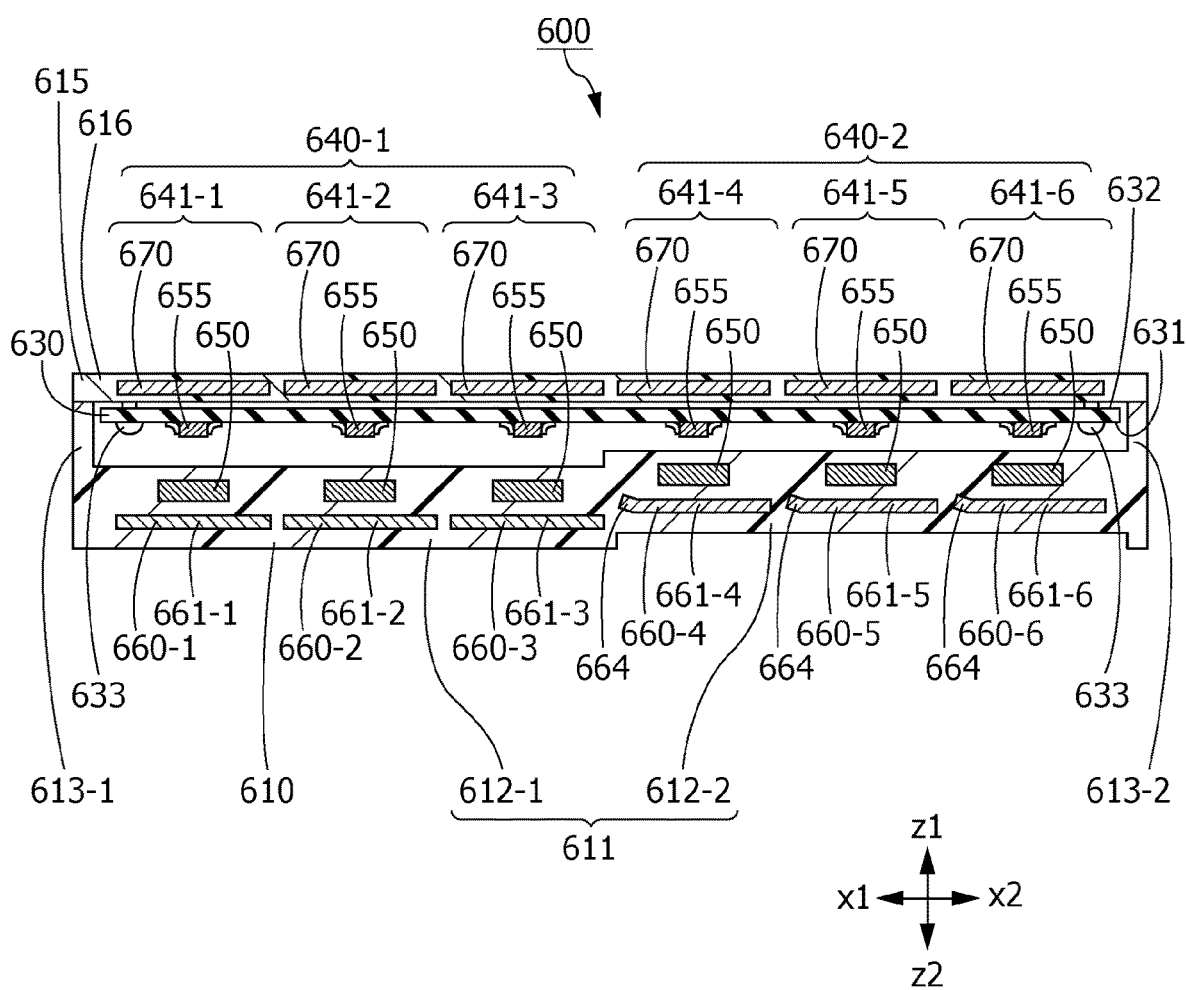
FIG. 12 is a cross-sectional view of a current sensor in a sixth embodiment.

Next, a current sensor in a sixth embodiment will be described. FIG. 12 is a cross-sectional view of the current sensor 600 in this embodiment at a cross section parallel to a zx plane. Differences between the current sensor 500 (FIG. 9) in the fifth embodiment and the current sensor 600 in this embodiment will be mainly described below. For the current sensor 500, illustrated in FIG. 9, in the fifth embodiment, the hundred's digit of the reference numeral of each constituent element is represented as 5. For the current sensor 600, illustrated in FIG. 12, in this embodiment, the hundred's digit of the reference numeral of each constituent element is represented as 6. Unless otherwise noted, constituent elements that differ only in the hundred's digit are similar to each other.

The shapes of all first magnetic shields 660 included in a small-current unit group 640-2 may be substantially the same. That is, all first magnetic shields 660 included in the small-current unit group 640-2 in this embodiment may be the same as the first magnetic shield 560-4 included in the fourth measurement unit 541-4 in the fifth embodiment (FIG. 9). As illustrated in FIG. 12, all first magnetic shields 660 included in the small-current unit group 640-2 include a first small-current protrusion 664, which is the same as the first small-current protrusion 564 in the fifth embodiment (FIG. 9).

Conclusion

According to this embodiment, effects similar to the effects in the sixth embodiment are obtained except for differences.

According to this embodiment, the shapes of all first magnetic shields 660 included in the small-current unit group 640-2 may be substantially the same, so a design is made easy with a difference in sensitivity suppressed among the measurement units 641 included in the small-current unit group 640-2. Also, manufacturing and management costs can be suppressed by using common parts.

Seventh Embodiment

Figure 13:
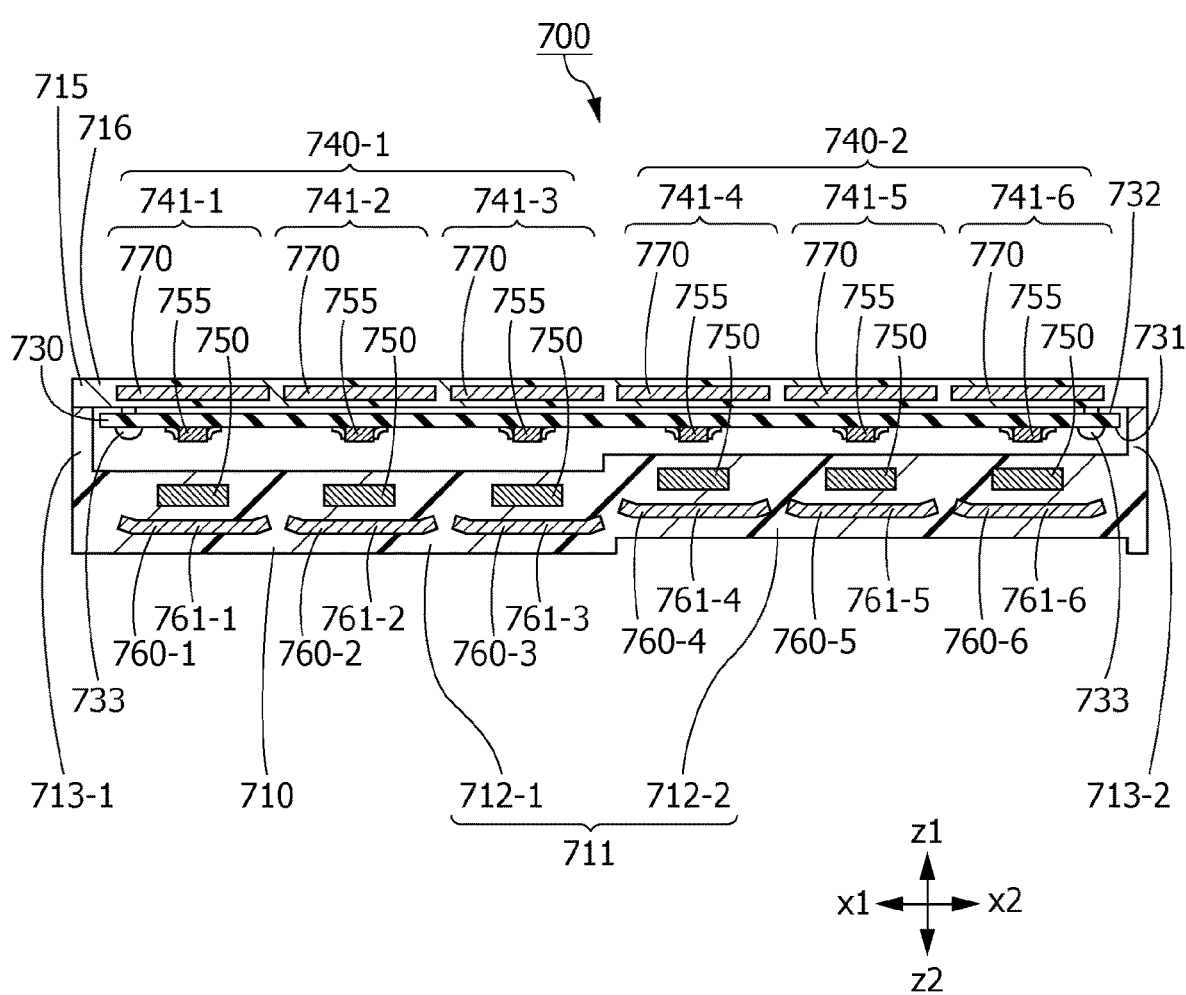
FIG. 13 is a cross-sectional view of a current sensor in a seventh embodiment.

Next, a current sensor in a seventh embodiment will be described. FIG. 13 is a cross-sectional view of the current sensor 700 in this embodiment at a cross section parallel to a zx plane. Differences between the current sensor 500 (FIG. 9) in the fifth embodiment and the current sensor 700 in this embodiment will be mainly described below. For the current sensor 500, illustrated in FIG. 9, in the fifth embodiment, the hundred's digit of the reference numeral of each constituent element is represented as 5. For the current sensor 700, illustrated in FIG. 13, in this embodiment, the hundred's digit of the reference numeral of each constituent element is represented as 7. Unless otherwise noted, constituent elements that differ only in the hundred's digit are similar to each other.

Figure 14:
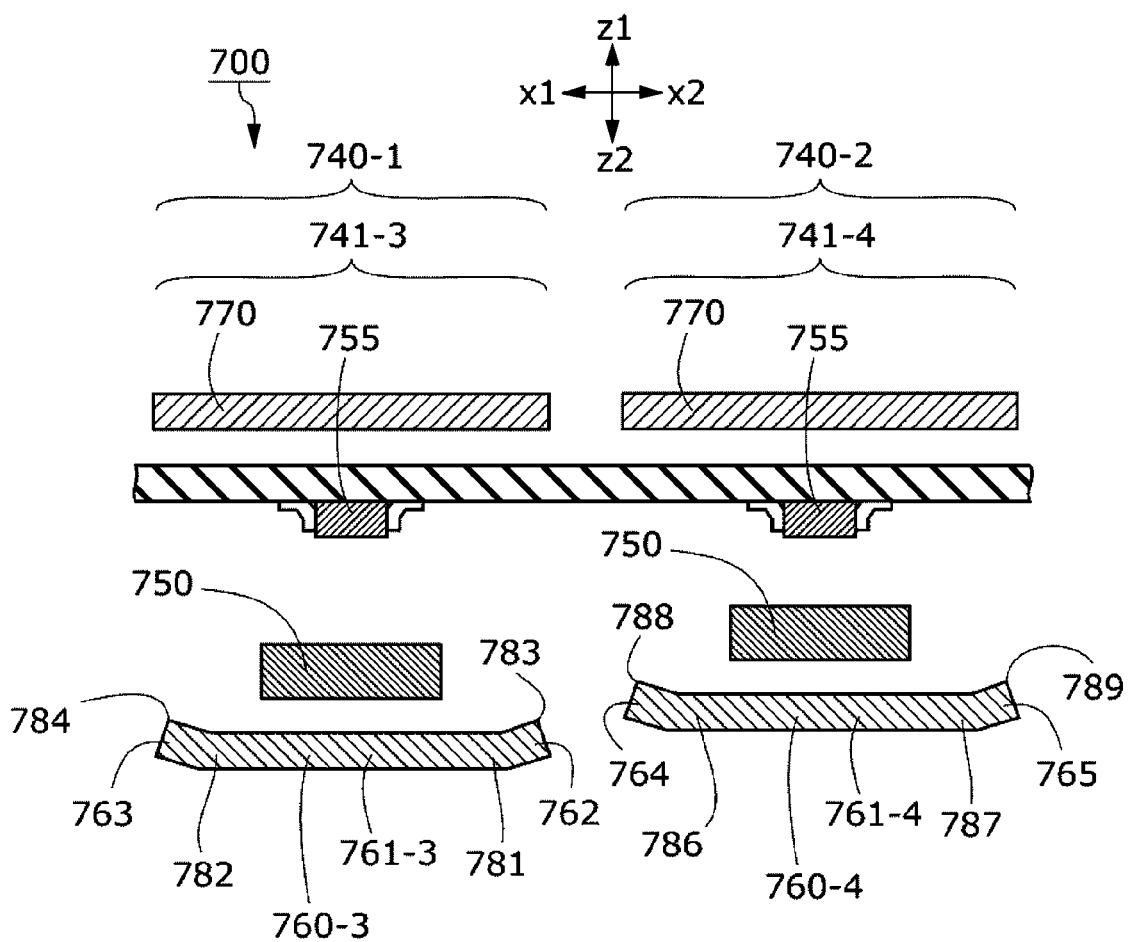
FIG. 14 is a partially enlarged cross-sectional view of the current sensor in the seventh embodiment.

FIG. 14 is a partially enlarged cross-sectional view of the third measurement unit 741-3, fourth measurement unit 741-4, and substrate 730 illustrated in FIG. 13. As illustrated in FIG. 14, the first magnetic shield 760-4 in the fourth measurement unit 741-4 includes a plate-like part 761-4 similar to that in the fifth embodiment and also includes a first small-current protrusion 764 similar to that in the fifth embodiment. Furthermore, the first magnetic shield 760-4 includes a second small-current protrusion 765 extending from a second edge 787 toward a second opposing part 716 (FIG. 13).

The width of the plate-like part 761-4 in the fourth measurement unit 741-4 in the x direction is slightly narrower than the width of the plate-like part 561-4 (FIG. 12) in the fifth embodiment. In the fourth measurement unit 741-4, the first magnetic shield 760-4 has a dyadic symmetric shape, which coincides when rotated 180 degrees around an axis parallel to the z direction. That is, when the first small-current protrusion 764 is rotated 180 degrees, it coincides with the second small-current protrusion 765. A second tip 789 of the second small-current protrusion 765 on the z1 side and a first tip 788 of the first small-current protrusion 764 on the z1 side are positioned on substantially the same planes parallel to an xy plane.

As illustrated in FIG. 13, the shapes of all first magnetic shields 760 included in a small-current unit group 740-2 may be substantially the same.

A first magnetic shield 760-3 in the third measurement unit 741-3 in this embodiment includes a plate-like part 761-3 expanding in parallel to an xy plane, a first large-current protrusion 762 extending from a first edge 781, on the x2 side, of the plate-like part 761-3, and a second large-current protrusion 763 extending from a second edge 782, on the x1 side, of the plate-like part 761-3.

The shape of the first magnetic shield 760-3 in the third measurement unit 741-3 matches a shape obtained by rotating the first magnetic shield 760-4 in the fourth measurement unit 741-4 180 degrees around an axis parallel to the z direction. That is, the plate-like part 761-3, first large-current protrusion 762, and second large-current protrusion 763 in the third measurement unit 741-3 respectively correspond to the plate-like part 761-4, first small-current protrusion 764, and second small-current protrusion 765 in the fourth measurement unit 741-4.

The first large-current protrusion 762 in the third measurement unit 741-3 in this embodiment functions, as is the first large-current protrusion 262 in the second embodiment (FIG. 2). As illustrated in FIG. 13, the shapes of all first magnetic shields 760 included in the large-current unit group 740-1 may be substantially the same.

Conclusion

According to this embodiment, effects similar to the effects in the first embodiment are obtained except for differences.

According to this embodiment, since each of one or more first magnetic shields 760 including the first small-current protrusion 764 has the second small-current protrusion 765 extending from the second edge 787 toward the second opposing part 716, the first magnetic shields 760 can be easily oriented in the same direction during manufacturing due to both the first small-current protrusion 764, and the second small-current protrusion 765, and the structures of part supplying portions in a manufacturing apparatus can be simplified.

According to this embodiment, the shapes of all first magnetic shields 760 may be substantially the same, so parts are made common and manufacturing and management costs can be suppressed by using common parts.

Eighth Embodiment

Figure 15:
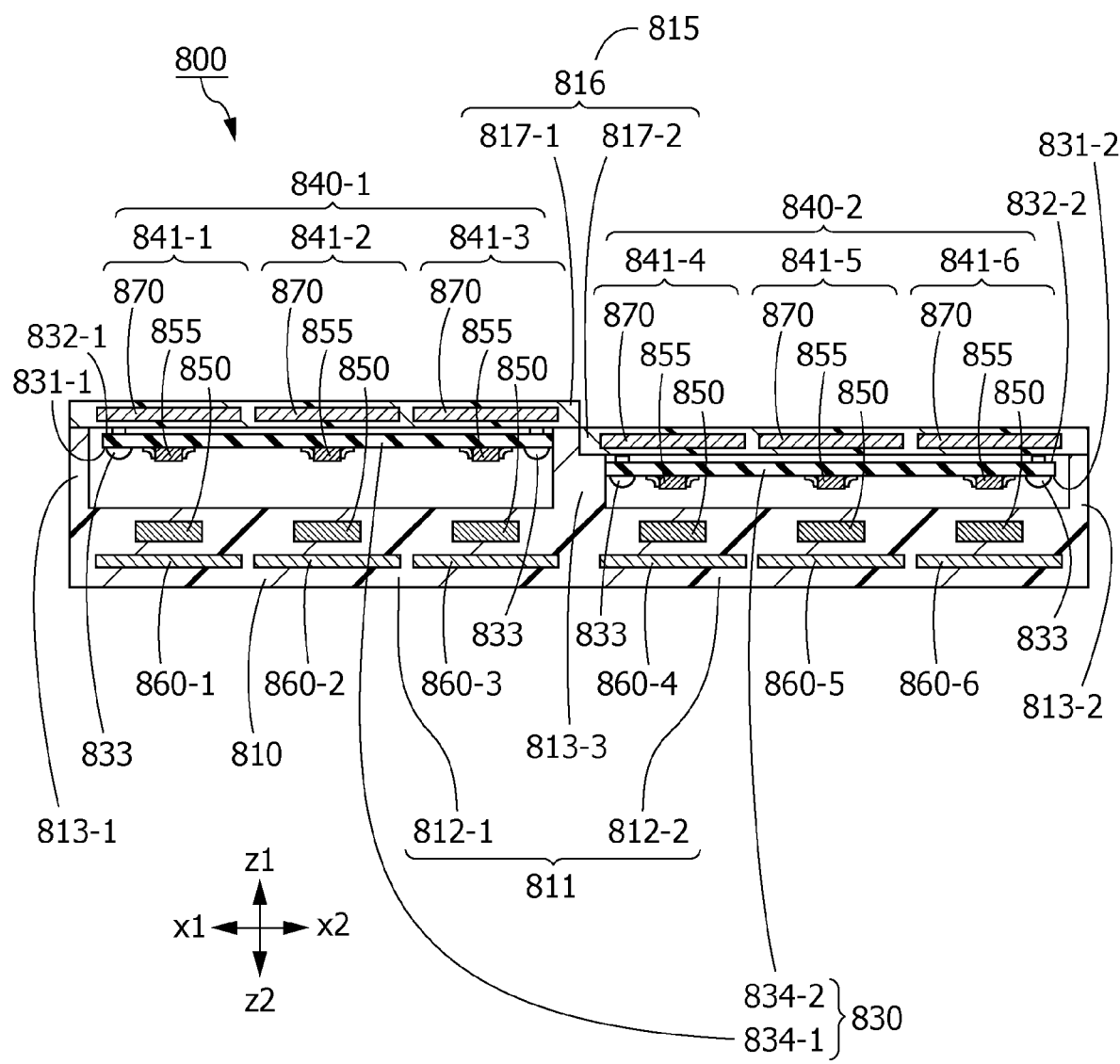
FIG. 15 is a cross-sectional view of a current sensor in an eighth embodiment.

Next, a current sensor in an eighth embodiment will be described. FIG. 15 is a cross-sectional view of the current sensor 800 in this embodiment at a cross section parallel to a zx plane. Differences between the current sensor 100 (FIG. 1) in the first embodiment and the current sensor 800 in this embodiment will be mainly described below. For the current sensor 100, illustrated in FIG. 1, in the first embodiment, the hundred's digit of the reference numeral of each constituent element is represented as 1. For the current sensor 800, illustrated in FIG. 15, in this embodiment, the hundred's digit of the reference numeral of each constituent element is represented as 8. Unless otherwise noted, constituent elements that differ only in the hundred's digit are similar to each other.

First Case

Unlike the first embodiment, a left first sub-opposing part 812-1 and a right first sub-opposing part 812-2 are not shifted in the z direction. A first case 810 includes a third support part 813-3 extending in the z1 direction from between the left first sub-opposing part 812-1 and the right first sub-opposing part 812-2.

Second Case

Unlike the first embodiment, a second opposing part 816 in this embodiment is divided into a left second sub-opposing part 817-1 and a right second sub-opposing part 817-2 (sometimes referred to below as second sub-opposing parts 817 without distinguishing between them). In another example, the second opposing part 816 may include three or more second sub-opposing parts 817.

The left second sub-opposing part 817-1 is positioned on the x1 side of the right second sub-opposing part 817-2. The left second sub-opposing part 817-1 is secured to the first case 810 by a first support part 813-1 and the third support part 813-3. The right second sub-opposing part 817-2 is secured to the first case 810 by a second support part 813-2 and the third support part 813-3.

The two second sub-opposing parts 817 have substantially the same shapes. Each of them is like a substantially flat plate that has two surfaces substantially parallel to an xy plane, and expands substantially in parallel to the xy plane. The thickness of the second sub-opposing parts 817 in the z direction is substantially constant at any position in the x direction. In the z direction, the right second sub-opposing part 817-2 is at position shifted from the left second sub-opposing part 817-1 in the z2 direction. The left second sub-opposing part 817-1 and left first sub-opposing part 812-1 are spaced apart in the z direction. The right second sub-opposing part 817-2 and right first sub-opposing part 812-2 are spaced apart in the z direction.

Substrate and Fixing Member

A substrate 830 in this embodiment differs from the substrate 130 in the first embodiment in that the substrate 830 includes a first sub-substrate 834-1 and a second sub-substrate 834-2 (sometimes referred to below as sub-substrates 834 without distinguishing between them). In another example, the substrate 830 may include three or more sub-substrates 834.

The first sub-substrate 834-1 is positioned between the left first sub-opposing part 812-1 and the left second sub-opposing part 817-1 in the z direction. The first sub-substrate 834-1 and left second sub-opposing part 817-1 are mutually secured by a plurality of fixing members 833. The first sub-substrate 834-1 is made of an insulating material and is like a substantially flat plate extending substantially in parallel to an xy plane. The first sub-substrate 834-1 has a left first mounting surface 831-1 on the same side as the left first sub-opposing part 812-1 and a left second mounting surface 832-1 on the same side as the left second sub-opposing part 817-1. Both the left first mounting surface 831-1 and the second mounting surface 832-1 are substantially parallel to an xy plane.

The second sub-substrate 834-2 is positioned between the right first sub-opposing part 812-2 and the right second sub-opposing part 817-2 in the z direction. The second sub-substrate 834-2 and right second sub-opposing part 817-2 are mutually secured by a plurality of fixing members 833. The second sub-substrate 834-2 is made of an insulating material and is like a substantially flat plate extending substantially in parallel to an xy plane. The second sub-substrate 834-2 has a right first mounting surface 831-2 on the same side as the right first sub-opposing part 812-2 and a right second mounting surface 832-2 on the same side as the right second sub-opposing part 817-2. Both the right first mounting surface 831-2 and the second mounting surface 832-2 are substantially parallel to an xy plane.

Unit Group

One first sub-opposing part 812, one second sub-opposing part 817, and one sub-substrate 834 correspond to one of a plurality of unit groups 840. Specifically, the left first sub-opposing part 812-1, left second sub-opposing part 817-1, and first sub-substrate 834-1 correspond to a large-current unit group 840-1. The right first sub-opposing part 812-2, right second sub-opposing part 817-2, and second sub-substrate 834-2 correspond to a small-current unit group 840-2.

All second magnetic shields 870 included in the large-current unit group 840-1 are mounted in the corresponding left second sub-opposing part 817-1 so as to be arranged on a plane substantially parallel to an xy plane. All second magnetic shields 870 included in the small-current unit group 840-2 are mounted in the corresponding right second sub-opposing part 817-2 as to be arranged on a plane substantially parallel to an xy plane. The three second magnetic shields 870 included in the small-current unit group 840-2 are shifted from the three second magnetic shields 870 included in the large-current unit group 840-1 toward the z2 side.

All magneto-electric conversion elements 855 included in the large-current unit group 840-1 are mounted on the first mounting surface 831-1 of the first corresponding sub-substrate 834-1 and expand along a plane substantially parallel to an xy plane. All magneto-electric conversion elements 855 included in the small-current unit group 840-2 are mounted on the first mounting surface 831-2 of the corresponding second sub-substrate 834-2 and expand along a plane substantially parallel to an xy plane.

All current paths 850 may be positioned on substantially the same planes substantially parallel to an xy plane. All first magnetic shields 860 may be positioned on substantially the same planes substantially parallel to an xy plane.

As a whole, the current sensor 800 in this embodiment is structured so that the small-current unit group 140-2 in the first embodiment (FIG. 1) is slightly shifted from the large-current unit group 140-1 in the z2 direction.

In this embodiment, the distance between constituent elements can be changed just by changing positions at which to attach the second sub-opposing parts 817 from the first sub-opposing part 812, and the rated current of a measurement target in each unit group 840 can thereby be changed. A combination of the second sub-opposing part 817 and sub-substrate 834 can be shared by a plurality of unit groups 840 targeted at different rated currents.

Conclusion

According to this embodiment, resin molding can be easily performed as in the first embodiment. In a structure in which the second distance differs for each unit group 840, each of the thickness of the first opposing part 811, the thickness of the second opposing part 816, and the first distance is substantially constant, so a resin is likely to flow in a mold during manufacturing. As a result, even if the positional relationship of constituent elements is not constant among a plurality of measurement units 841 that measure an induced magnetic field, the current sensor 800 can be provided that enables the plurality of measurement units 841 to be integrally manufactured with ease.

According to this embodiment, the magneto-electric conversion element 855 and second magnetic shield 870 that are included in the measurement unit 841 shared between them may be positioned so as to be separated by the third distance in the first direction. In all measurement units 841, the third distance may be shorter than the second distance. In all measurement units 841, all third distances may be substantially the same. Therefore, measurement precision can be made higher than in another placement.

According to this embodiment: each of the plurality of unit groups 840 includes the same number of measurement units 841; the second opposing part 816 includes a plurality of second sub-opposing parts 817 having substantially the same shapes; the substrate 830 includes a plurality of sub-substrates 834 having substantially the same shapes; one second sub-opposing part 817 and one sub-substrate 834 correspond to one of the plurality of unit groups 840; the second sub-opposing part 817 and sub-substrate 834 that correspond to the same unit group 840 are mutually secured; in each second sub-opposing part 817, all second magnetic shields 870 included in the unit group 840 corresponding to the second sub-opposing part 817 are mounted; and on each sub-substrate 834, all magneto-electric conversion elements 855 included in the unit group 840 corresponding to the sub-substrate 834 are mounted. Therefore, it is possible to assemble the second sub-opposing part 817 and sub-substrate 834 together so that the assemble part is shared by a plurality of unit groups 840 and thereby to reduce manufacturing costs.

According to this embodiment, all current paths 850 may be positioned on substantially the same planes and all first magnetic shields 860 may be positioned on substantially the same planes, so the shape of the first opposing part 811 is simplified, making it easy to perform resin molding.

Ninth Embodiment

Figure 16:
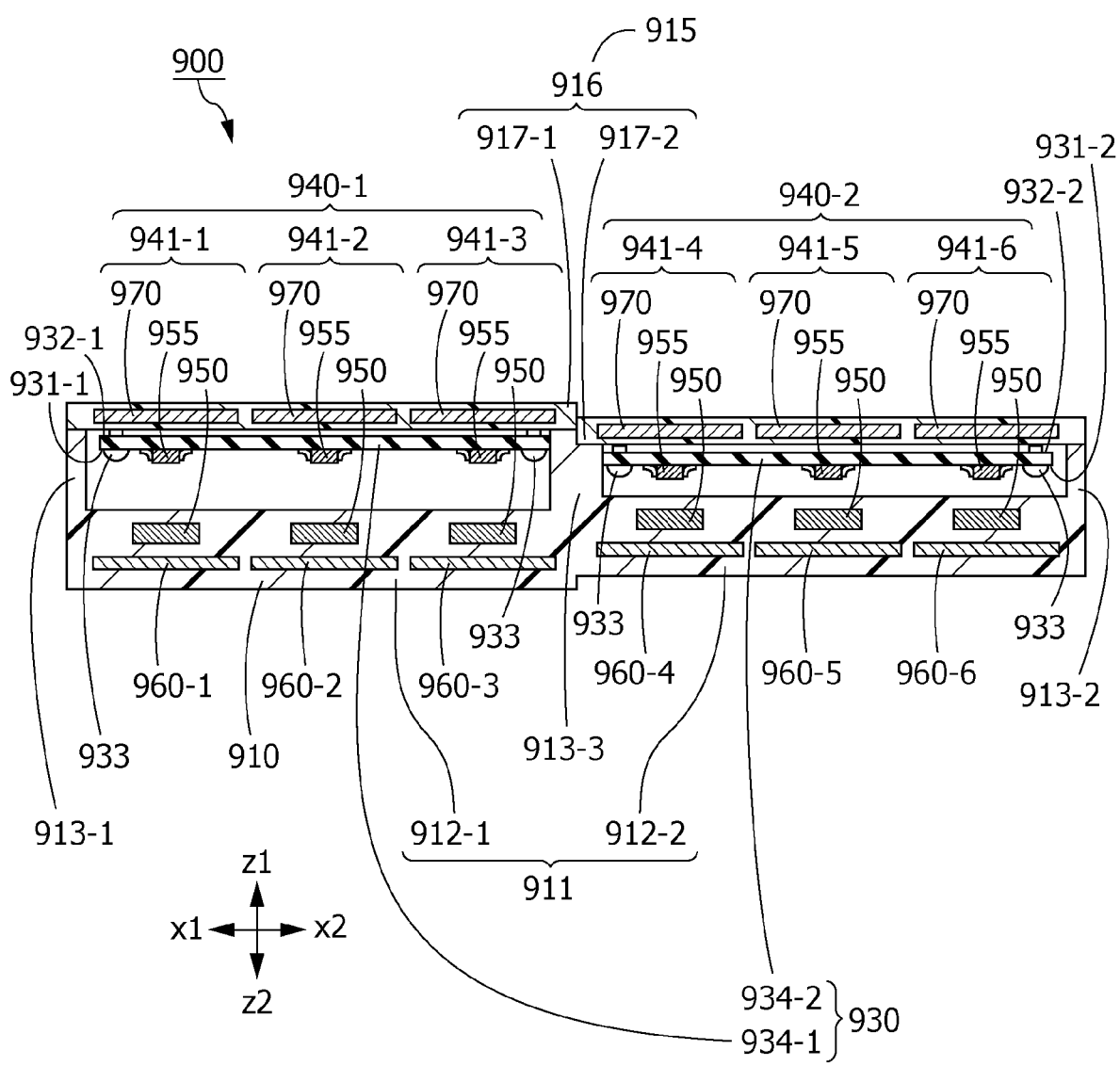
FIG. 16 is a cross-sectional view of a current sensor in a ninth embodiment.

Next, a current sensor in a ninth embodiment will be described. FIG. 16 is a cross-sectional view of the current sensor 900 in this embodiment at a cross section parallel to a zx plane. Differences between the current sensor 800 (FIG. 15) in the eighth embodiment and the current sensor 900 in this embodiment will be mainly described below. For the current sensor 800, illustrated in FIG. 15, in the eighth embodiment, the hundred's digit of the reference numeral of each constituent element is represented as 8. For the current sensor 900, illustrated in FIG. 16, in this embodiment, the hundred's digit of the reference numeral of each constituent element is represented as 9. Unless otherwise noted, constituent elements that differ only in the hundred's digit are similar to each other. Also, as in the eighth embodiment, the first embodiment will be referenced in this embodiment as well.

A right first sub-opposing part 912-2 in this embodiment is shifted in the z1 direction from a left first sub-opposing part 912-1 by almost the same amount as in the first embodiment. Furthermore, three current paths 950 included in a small-current unit group 940-2 are shifted in the z1 direction from three current paths 950 included in a large-current unit group 940-1 by almost the same amount as in the first embodiment. Three first magnetic shields 960 included in the small-current unit group 940-2 are shifted in the z1 direction from three current paths 960 included in the large-current unit group 940-1 by almost the same amount as in the first embodiment.

Three second magnetic shields 970 included in the small-current unit group 940-2 are shifted in the z2 direction from three second magnetic shields 970 included in the large-current unit group 940-1. Three magneto-electric conversion element 955 included in the small-current unit group 940-2 are shifted in the z2 direction from three magneto-electric conversion elements 955 included in the large-current unit group 940-1.

Conclusion

According to this embodiment, effects similar to the effects in the eighth embodiment are obtained except that the right first sub-opposing part 912-2 is shifted in the z1 direction from the left first sub-opposing part 912-1.

Tenth Embodiment

Figure 17:
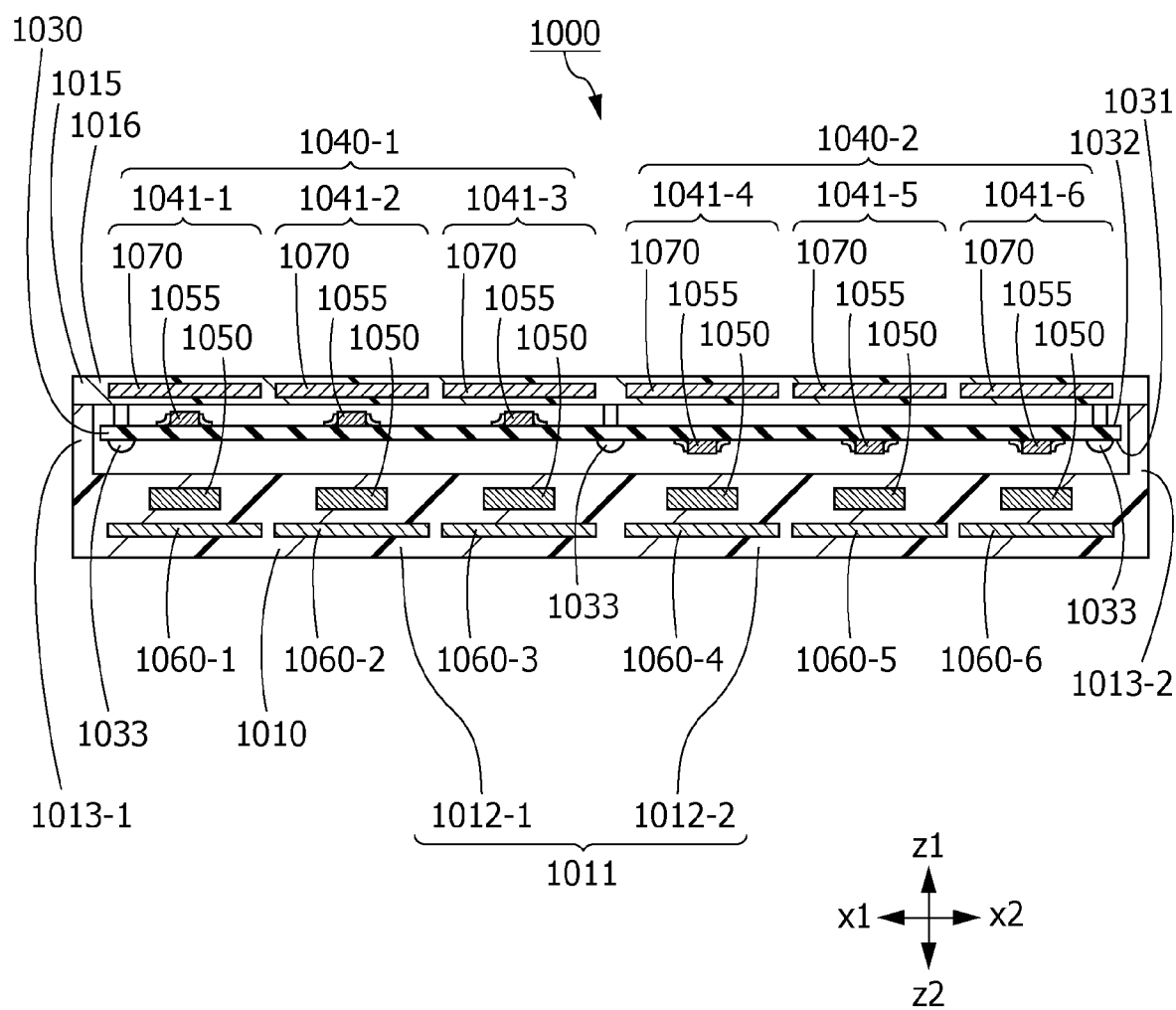
FIG. 17 is a cross-sectional view of a current sensor in a tenth embodiment.

Next, a current sensor in a tenth embodiment will be described. FIG. 17 is a cross-sectional view of the current sensor 1000 in this embodiment at a cross section parallel to a zx plane. Differences between the current sensor 100 (FIG. 1) in the first embodiment and the current sensor 1000 in this embodiment will be mainly described below. For the current sensor 100, illustrated in FIG. 1, in the first embodiment, the hundred's digit of the reference numeral of each constituent element is represented as 1. For the current sensor 1000, illustrated in FIG. 17, in this embodiment, the hundred's and higher digits of the reference numeral of each constituent element are represented as 10. Unless otherwise noted, constituent elements that differ only in the hundred's and higher digits are similar to each other.

Unlike the first embodiment, a left first sub-opposing part 1012-1 and a right first sub-opposing part 1012-2 are not shifted in the z direction. All current paths 1050 may be positioned on substantially the same planes substantially parallel to an xy plane. All first magnetic shields 1060 may be positioned on substantially the same planes substantially parallel to an xy plane. All second magnetic shields 1070 may be positioned on substantially the same planes substantially parallel to an xy plane.

All magneto-electric conversion elements 1055 included in a large-current unit group 1040-1 are mounted on a second mounting surface 1032 of a substrate 1030 so as to be positioned along a plane substantially parallel to an xy plane. All magneto-electric conversion elements 1055 included in a small-current unit group 1040-2 are mounted on a first mounting surface 1031 of the substrate 1030 so as to be positioned along a plane substantially parallel to an xy plane.

In another example in which three or more unit groups 1040 are included, all magneto-electric conversion elements 1055 included in one or more unit groups 1040 may be mounted on the first mounting surface 1031. In the other example in which three or more unit groups 1040 are included, all magneto-electric conversion elements 1055 included in another one or more unit groups 1040 may be mounted on the second mounting surface 1032.

As in the first embodiment, the distance in the z direction between the second magnetic shield 1070 and magneto-electric conversion element 1055 that are included in the measurement unit 1041 shared between them will be referred to as the third distance. The third distance in the large-current unit group 1040-1 may be shorter than the third distance in the small-current unit group 1040-2.

Conclusion

According to this embodiment, resin molding can be easily performed as in the first embodiment. In a structure in which the second distance differs for each unit group 1040, each of the thickness of a first opposing part 1011, the thickness of a second opposing part 1016, and the first distance is substantially constant, so a resin is likely to flow in a mold during manufacturing. As a result, even if the positional relationship of constituent elements is not constant among a plurality of measurement units 1041 that measure an induced magnetic field, the current sensor 1000 can be provided that enables the plurality of measurement units 1041 to be integrally manufactured with ease.

According to this embodiment: all current paths 1050 may be positioned on substantially the same planes; all first magnetic shields 1060 may be positioned on substantially the same planes; the substrate 1030 may have the first mounting surface 1031 on the same side as the first opposing part 1011, and may also have the second mounting surface 1032 on the same side as the second opposing part 1016; all magneto-electric conversion elements 1055 included in one or more unit groups 1040 may be mounted on the first mounting surface 1031; and all magneto-electric conversion elements 1055 included in another one or more unit groups 1040 may be mounted on the second mounting surface 1032.

Therefore, the distance between the magneto-electric conversion element 1055 and the current path 1050 can be changed depending on the mounting surface, first mounting surface 1031 or second mounting surface 1032, on which the magneto-electric conversion element 1055 is mounted during manufacturing, making manufacturing easy.

For example, in the unit group 1040 that measures a large current, when magneto-electric conversion elements 1055 are brought close to the second magnetic shield 1070 by mounting these magneto-electric conversion elements 1055 on the second mounting surface 1032, sensitivity can be intentionally suppressed. By contrast, in the unit group 1040 that measures a small current, when magneto-electric conversion elements 1055 are distanced from the second magnetic shield 1070 by mounting these magneto-electric conversion elements 1055 on the first mounting surface 1031, sensitivity can be increased.

According to this embodiment: one of the plurality of unit groups 1040 may be the large-current unit group 1040-1; another one of the plurality of unit groups 1040 may be the small-current unit group 1040-2; the second magnetic shield 1070 and magneto-electric conversion element 1055 that are included in the measurement unit 1041 shared between them may be positioned so as to be separated by the third distance in the first direction; and the third distance in the large-current unit group 1040-1 may be shorter than the third distance in the small-current unit group 1040-2. Therefore, sensitivity in the small-current unit group 1040-2 can be made higher than sensitivity in the large-current unit group 1040-1.

Eleventh Embodiment

Figure 18:
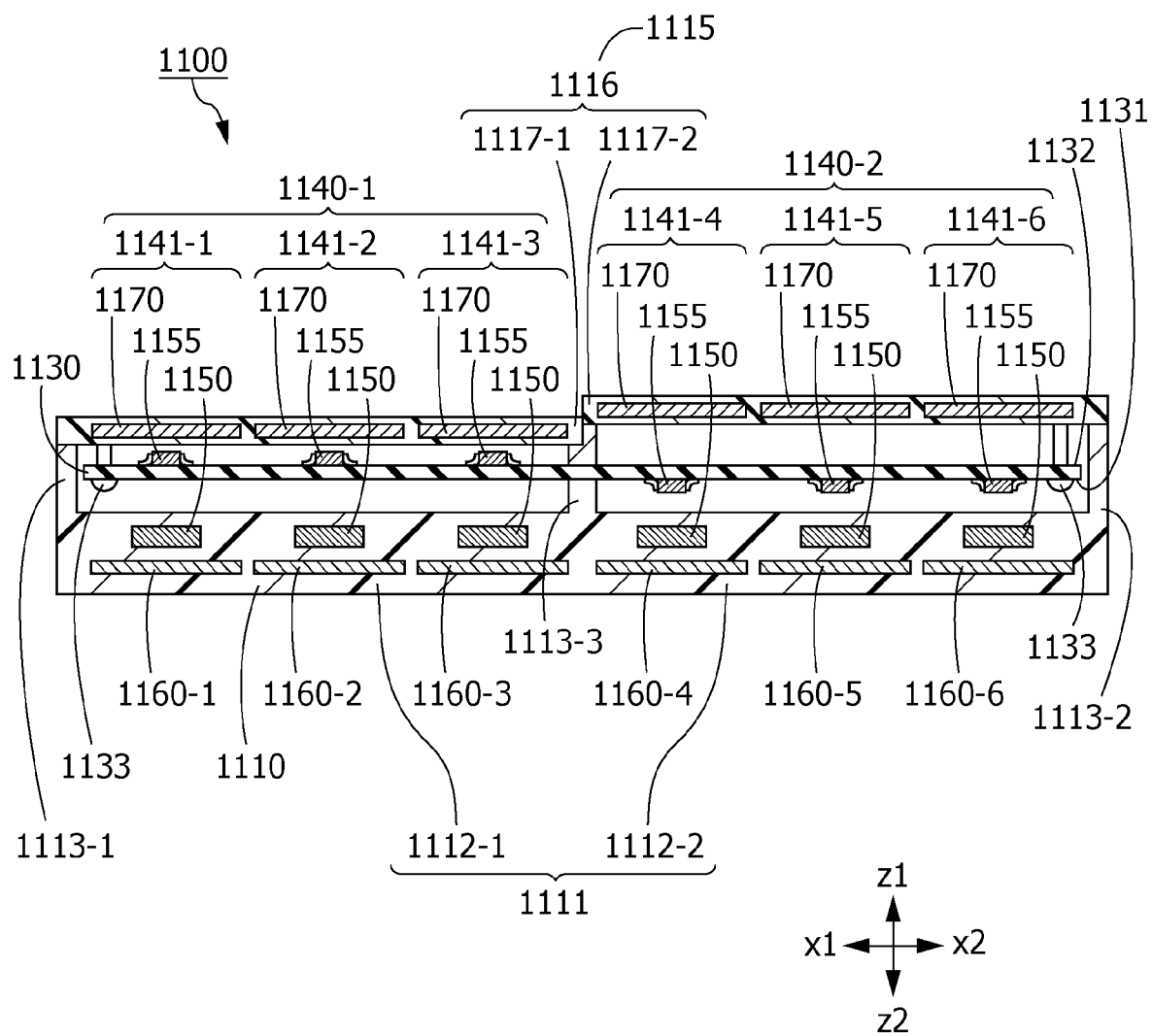
FIG. 18 is a cross-sectional view of a current sensor in an eleventh embodiment.

Next, a current sensor in an eleventh embodiment will be described. FIG. 18 is a cross-sectional view of the current sensor 1100 in this embodiment at a cross section parallel to a zx plane. Differences between the current sensor 1000 (FIG. 17) in the tenth embodiment and the current sensor 1100 in this embodiment will be mainly described below. For the current sensor 1000, illustrated in FIG. 17, in the tenth embodiment, the hundred's and higher digits of the reference numeral of each constituent element are represented as 10. For the current sensor 1100, illustrated in FIG. 18, in this embodiment, the hundred's and higher digits of the reference numeral of each constituent element are represented as 11. Unless otherwise noted, constituent elements that differ only in the hundred's and higher digits are similar to each other.

A first case 1110 includes a third support part 1113-3 extending in the z1 direction from between a left first sub-opposing part 1112-1 and a right first sub-opposing part 1112-2. The third support part 1113-3 partially passes through a substrate 1130.

Unlike the first embodiment, a second opposing part 1116 in this embodiment is divided into a left second sub-opposing part 1117-1 and a right second sub-opposing part 1117-2 (sometimes referred to below as second sub-opposing parts 1117 without distinguishing between them). In another example, the second opposing part 1116 may include three or more second sub-opposing parts 1117.

The left second sub-opposing part 1117-1 is positioned on the x1 side of the right second sub-opposing part 1117-2. The left second sub-opposing part 1117-1 is secured to the first case 1110 by a first support part 1113-1 and the third support part 1113-3. The right second sub-opposing part 1117-2 is secured to the first case 1110 by a second support part 1113-2 and the third support part 1113-3.

The two second sub-opposing parts 1117 have substantially the same shapes. Each of them is like a substantially flat plate that has two surfaces substantially parallel to an xy plane and expands substantially in parallel to the xy plane. The thickness of the second sub-opposing parts 1117 in the z direction is substantially constant at any position in the x direction. In the z direction, the right second sub-opposing part 1117-2 is at position shifted from the left second sub-opposing part 1117-1 in the z2 direction. The left second sub-opposing part 1117-1 and left first sub-opposing part 1112-1 are spaced apart in the z direction. The right second sub-opposing part 1117-2 and right first sub-opposing part 1112-2 are spaced apart in the z direction.

All second magnetic shields 1170 included in a large-current unit group 1140-1 are mounted in the left second sub-opposing part 1117-1 so as to be arranged on a plane substantially parallel to an xy plane. All second magnetic shields 1170 included in a small-current unit group 1140-2 are mounted in the right second sub-opposing part 1117-2 so as to be arranged on a plane substantially parallel to an xy plane. The three second magnetic shields 1170 included in the small-current unit group 1140-2 are shifted from the three second magnetic shields 1170 included in the large-current unit group 1140-1 toward the z1 side.

As in the first embodiment, the distance in the z direction between the second magnetic shield 1170 and a magneto-electric conversion element 1155 that are included in the measurement unit 1141 shared between them will be referred to as the third distance. The third distance in the large-current unit group 1140-1 may be shorter than the third distance in the small-current unit group 1140-2.

As in the first embodiment, the distance in the z direction between a current path 1150 and the second magnetic shield 1170 that are included in the measurement unit 1141 shared between them will be referred to as the fourth distance. The fourth distance in the large-current unit group 1140-1 may differ from the fourth distance in the small-current unit group 1140-2; the fourth distance in the large-current unit group 1140-1 may be shorter than the fourth distance in the small-current unit group 1140-2.

Conclusion

According to this embodiment, resin molding can be easily performed as in the first embodiment. In a structure in which the second distance differs for each unit groups 1140, each of the thickness of a first opposing part 1111, the thickness of a second opposing part 1116, and the first distance is substantially constant, so a resin is likely to flow in a mold during manufacturing. As a result, even if the positional relationship of constituent elements is not constant among a plurality of measurement units 1141 that measure an induced magnetic field, the current sensor 1100 can be provided that enables the plurality of measurement units 1141 to be integrally manufactured with ease.

According to this embodiment: all current paths 1150 may be positioned on substantially the same planes; all first magnetic shields 1160 may be positioned on substantially the same planes; the substrate 1130 may have the first mounting surface 1131 on the same side as the first opposing part 1111 and may also have a second mounting surface 1132 on the same side as the second opposing part 1116; all magneto-electric conversion elements 1155 included in one or more unit groups 1140 may be mounted on the first mounting surface 1131; and all magneto-electric conversion elements 1155 included in another one or more unit groups 1140 may be mounted on the second mounting surface 1132. Therefore, the distance between the magneto-electric conversion element 1155 and the current path 1150 can be changed depending on the mounting surface, first mounting surface 1131 or second mounting surface 1132, on which the magneto-electric conversion element 1155 is mounted during manufacturing, making manufacturing easy.

According to this embodiment: one of the plurality of unit groups 1140 may be the large-current unit group 1140-1; another one of the plurality of unit groups 1140 may be the small-current unit group 1140-2; the current path 1150 and second magnetic shield 1170 that are included in the measurement unit 1141 shared between them may be positioned so as to be separated by the fourth distance in the first direction; the fourth distance in the large-current unit group 1140-1 may differ from the fourth distance in the small-current unit group 1140-2. Therefore, when the distance between the magneto-electric conversion element 1155 and the current path 1150 is changed depending on the mounting surface, first mounting surface 1131 or second mounting surface 1132, on which the magneto-electric conversion element 1155 is mounted, sensitivity for each unit groups 1140 can be simply adjusted by further adjusting the distance between the magneto-electric conversion element 1155 and the second magnetic shield 1170.

According to this embodiment: one of the plurality of unit groups 1140 may be the large-current unit group 1140-1; another one of the plurality of unit groups 1140 may be the small-current unit group 1140-2; the second magnetic shield 1170 and magneto-electric conversion element 1155 that are included in the measurement unit 1141 shared between them may be positioned so as to be separated by the third distance in the first direction; and the third distance in the large-current unit group 1140-1 may be shorter than the third distance in the small-current unit group 1140-2. Therefore, sensitivity in the small-current unit group 1140-2 can be made higher than sensitivity in the large-current unit group 1140-1.

Twelfth Embodiment

Figure 19:
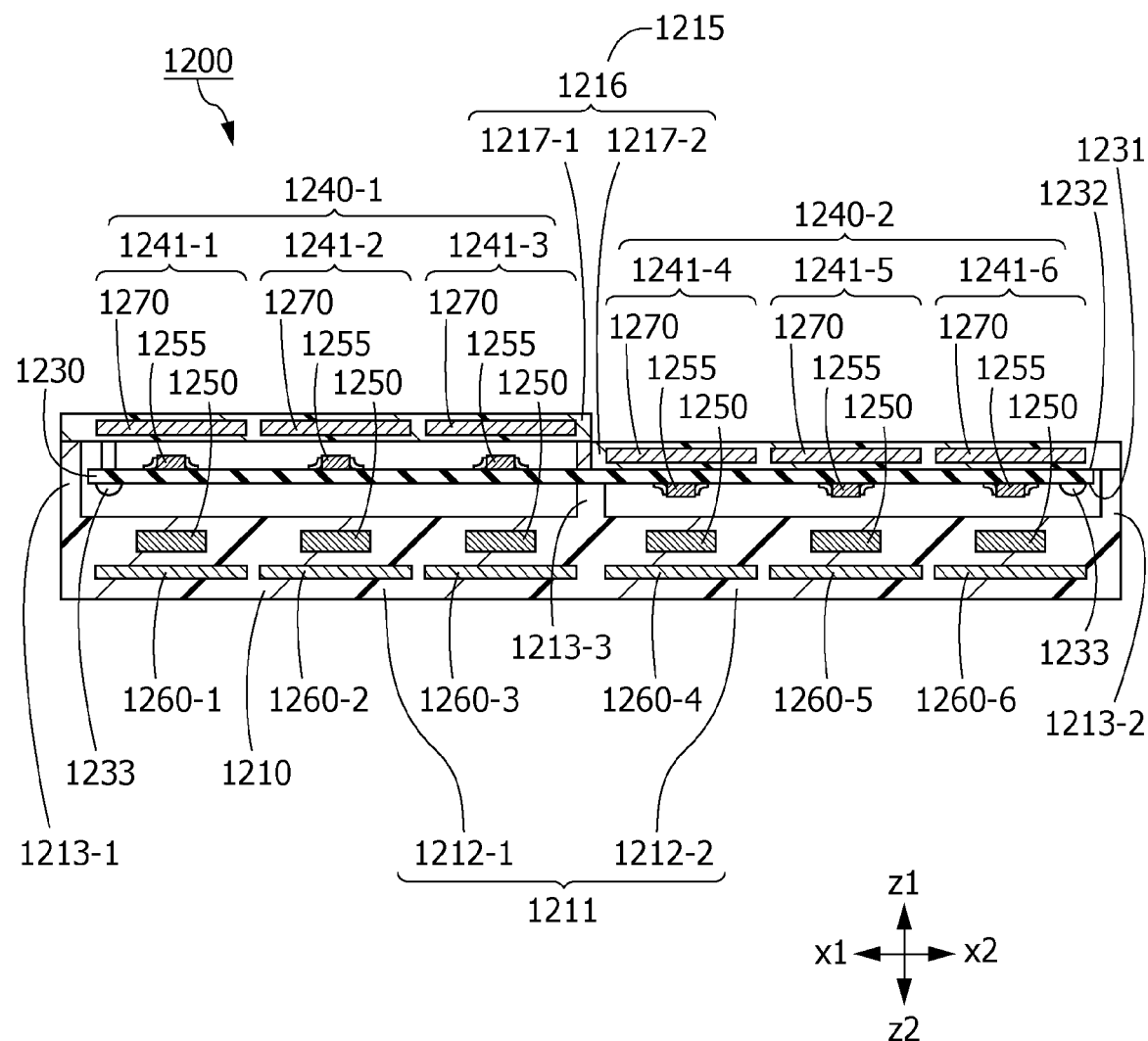
FIG. 19 is a cross-sectional view of a current sensor in a twelfth embodiment.

Next, a current sensor in a twelfth embodiment will be described. FIG. 19 is a cross-sectional view of the current sensor 1200 in this embodiment at a cross section parallel to a zx plane. Differences between the current sensor 1100 (FIG. 18) in the eleventh embodiment and the current sensor 1200 in this embodiment will be mainly described below. For the current sensor 1100, illustrated in FIG. 18, in the eleventh embodiment, the hundred's and higher digits of the reference numeral of each constituent element are represented as 11. For the current sensor 1200, illustrated in FIG. 19, in this embodiment, the hundred's and higher digits of the reference numeral of each constituent element are represented as 12. Unless otherwise noted, constituent elements that differ only in the hundred's and higher digit are similar to each other.

In the z direction, a right second sub-opposing part 1217-2 is at position shifted from a left second sub-opposing part 1217-1 in the z2 direction. Three second magnetic shields 1270 included in a small-current unit group 1240-2 are shifted from three second magnetic shields 1270 included in a large-current unit group 1240-1 toward the z2 side.

As in the first embodiment, the distance in the z direction between a current path 1250 and magneto-electric conversion element 1255 that are included in a measurement unit 1241 shared between them will be referred to as the second distance. Also, as in the first embodiment, the distance in the z direction between the magneto-electric conversion element 1255 and second magnetic shield 1270 that are included in the measurement unit 1241 shared between them will be referred to as the third distance. In all measurement units 1241, the third distance may be shorter than the second distance. In all measurement units 1241, all third distances may be substantially the same.

As in the first embodiment, the distance in the z direction between the current path 1250 and second magnetic shield 1270 that are included in the measurement unit 1241 shared between them will be referred to as the fourth distance. The fourth distance in the large-current unit group 1240-1 may differ from the fourth distance in the small-current unit group 1240-2; the fourth distance in the large-current unit group 1240-1 may be longer than the fourth distance in the small-current unit group 1240-2.

Conclusion

According to this embodiment, resin molding can be easily performed as in the first embodiment. In a structure in which the second distance differs for each unit group 1240, each of the thickness of a first opposing part 1211, the thickness of a second opposing part 1216, and the first distance is substantially constant, so a resin is likely to flow in a mold during manufacturing. As a result, even if the positional relationship of constituent elements is not constant among a plurality of measurement units 1241 that measure an induced magnetic field, the current sensor 1200 can be provided that enables the plurality of measurement units 1241 to be integrally manufactured with ease.

According to this embodiment, the magneto-electric conversion element 1255 and second magnetic shield 1270 that are included in the measurement unit 1241 shared between them may be positioned so as to be separated by the third distance in the first direction. In all measurement units 1241, the third distance may be shorter than the second distance. In all measurement units 1241, all third distances may be substantially the same. Therefore, measurement precision can be made higher than in another placement.

According to this embodiment: all current paths 1250 may be positioned on substantially the same planes; all first magnetic shields 1260 may be positioned on substantially the same planes; a substrate 1230 may have a first mounting surface 1231 on the same side as the first opposing part 1211 and may also have a second mounting surface 1232 on the same side as the second opposing part 1216; all magneto-electric conversion elements 1255 included in one or more unit groups 1240 may be mounted on the first mounting surface 1231; and all magneto-electric conversion elements 1255 included in another one or more unit groups 1240 may be mounted on the second mounting surface 1232. Therefore, the distance between the magneto-electric conversion element 1255 and the current path 1250 can be changed depending on the mounting surface, first mounting surface 1231 or second mounting surface 1232, on which the magneto-electric conversion element 1255 is mounted during manufacturing, making manufacturing easy.

According to this embodiment: one of the plurality of unit groups 1240 may be the large-current unit group 1240-1; another one of the plurality of unit groups 1240 may be the small-current unit group 1240-2; the current path 1250 and second magnetic shield 1270 that are included in the measurement unit 1241 shared between them may be positioned so as to be separated by the fourth distance in the first direction; and the fourth distance in the large-current unit group 1240-1 may differ from the fourth distance in the small-current unit group 1240-2. Therefore, when the distance between the magneto-electric conversion element 1255 and the current path 1250 is changed depending on the mounting surface, first mounting surface 1231 or second mounting surface 1232, on which the magneto-electric conversion element 1255 is mounted, sensitivity for each unit group 1240 can be simply adjusted by further adjusting the distance between the magneto-electric conversion element 1255 and the second magnetic shield 1270.

According to this embodiment, the magneto-electric conversion element 1255 and second magnetic shield 1270 that are included in the measurement unit 1241 shared between them may be positioned so as to be separated by the third distance in the first direction. In all measurement units 1241, all third distances may be substantially the same. Therefore, measurement precision can be made higher than in another placement.

Thirteenth Embodiment

Figure 20:
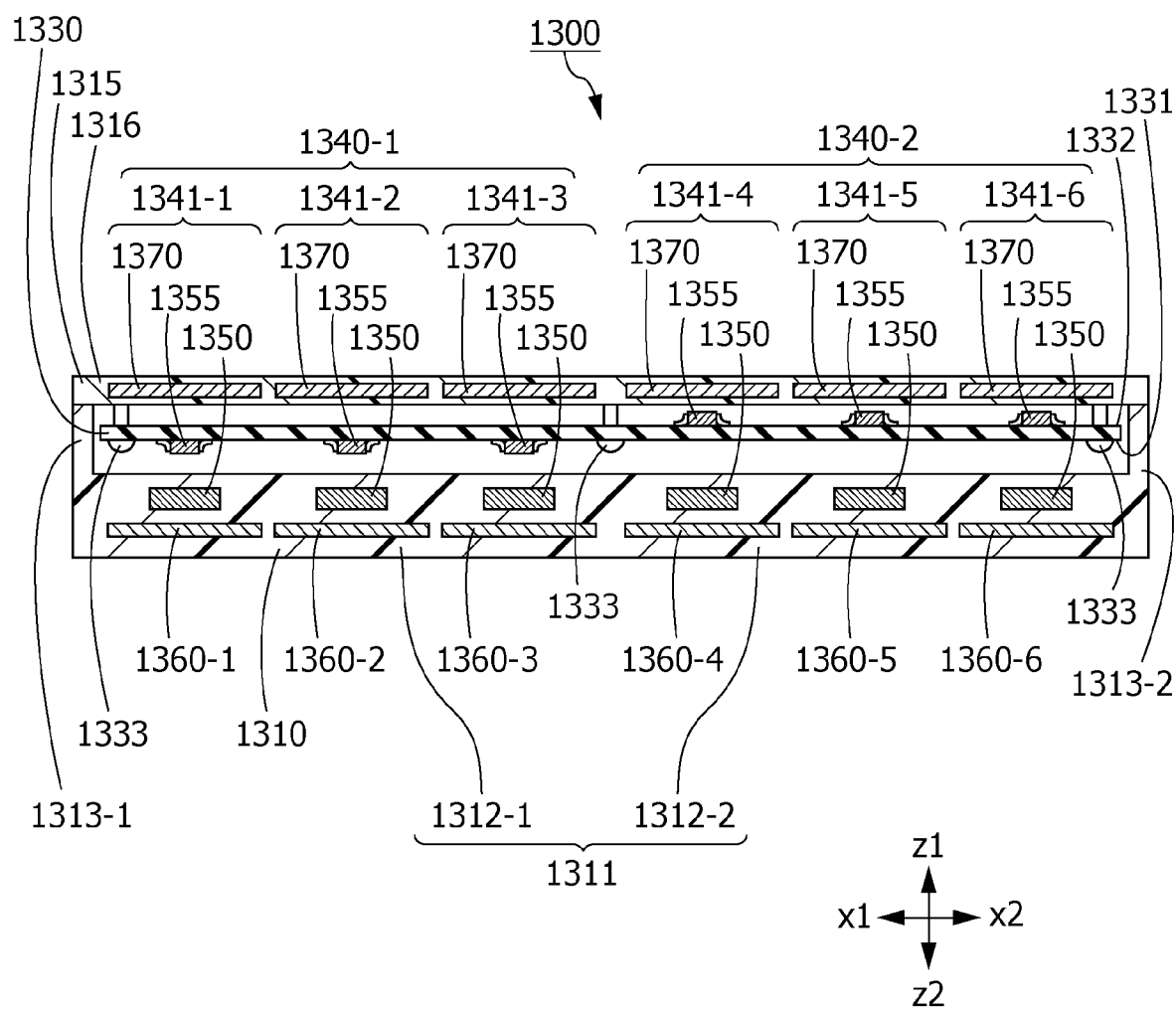
FIG. 20 is a cross-sectional view of a current sensor in a thirteenth embodiment.

Next, a current sensor in a thirteenth embodiment will be described. FIG. 20 is a cross-sectional view of the current sensor 1300 in this embodiment at a cross section parallel to a zx plane. Differences between the current sensor 1000 (FIG. 17) in the tenth embodiment and the current sensor 1300 in this embodiment will be mainly described below. For the current sensor 1000, illustrated in FIG. 17, in the tenth embodiment, the hundred's and higher digits of the reference numeral of each constituent element are represented as 10. For the current sensor 1300, illustrated in FIG. 20, in this embodiment, the hundred's and higher digits of the reference numeral of each constituent element are represented as 13. Unless otherwise noted, constituent elements that differ only in the hundred's digit are similar to each other.

All magneto-electric conversion elements 1355 included in a large-current unit group 1340-1 are mounted on a first mounting surface 1331 of a substrate 1330 so as to be positioned along a plane substantially parallel to an xy plane. All magneto-electric conversion elements 1355 included in a small-current unit group 1340-2 are mounted on the second mounting surface 1332 of the substrate 1330 so as to be positioned along a plane substantially parallel to an xy plane.

As in the first embodiment, the distance in the z direction between a second magnetic shield 1370 and the magneto-electric conversion element 1355 that are included in a measurement unit 1341 shared between them will be referred to as the third distance. The third distance in a large-current unit group 1340-1 may be longer than the third distance in a small-current unit group 1340-2.

Conclusion

According to this embodiment, resin molding can be easily performed as in the first embodiment. In a structure in which the second distance differs for each unit group 1340, each of the thickness of a first opposing part 1311, the thickness of a second opposing part 1316, and the first distance is substantially constant, so a resin is likely to flow in a mold during manufacturing. As a result, even if the positional relationship of constituent elements is not constant among a plurality of measurement units 1341 that measure an induced magnetic field, the current sensor 1300 can be provided that enables the plurality of measurement units 1341 to be integrally manufactured with ease.

According to this embodiment: one of the plurality of unit groups 1340 may be the large-current unit group 1340-1; another one of the plurality of unit groups 1340 may be the small-current unit group 1340-2; the second magnetic shield 1370 and magneto-electric conversion element 1355 that are included in the measurement unit 1341 shared between them may be positioned so as to be separated by the third distance in the first direction; and the third distance in the large-current unit group 1340-1 may be longer than the third distance in the small-current unit group 1340-2. Therefore, sensitivity in the small-current unit group 1340-2 can be made lower than sensitivity in the large-current unit group 1340-1.

The present invention is not limited to the embodiments described above. That is, a person having ordinary skill in the art may make various modifications, combinations, sub-combinations, and replacements for the constituent elements in the embodiments described above, without departing from the technical range of the present invention or an equivalent range of the technical range.

INDUSTRIAL APPLICABILITY

The present invention can be applied to various current sensors in which the positional relationship of constituent elements is not constant among a plurality of measurement units that measure an induced magnetic field.

What is claimed is:
1. A current sensor comprising:
a first opposing part;
a second opposing part;
a first case made of a resin, the first case including the first opposing part;
a second case made of a resin, the second case including the second opposing part;
a substrate mounted in at least one of the first case and the second case; and
a plurality of unit groups mounted in the first case and the second case, each unit group measuring an induced magnetic field; wherein:
the first opposing part and the second opposing part are positioned so as to be opposite to each other in a first direction;
the plurality of unit groups are arranged in a second direction intersecting the first direction;
each of the plurality of unit groups includes one or more measurement units arranged in the second direction;
each of the one or more measurement units includes:
a first magnetic shield integral with the first opposing part,
a second magnetic shield integral with the second opposing part,
a current path integral with the first opposing part between the first magnetic shield and the second magnetic shield, and
a magneto-electric conversion element configured to measure an induced magnetic field generated by a current flowing in the current path,
the magneto-electric conversion element is mounted, on the substrate, between the current path and the second magnetic shield in the first direction;
the current path and the first magnetic shield that are included in a measurement unit of the one or more measurement units shared between the current path and the first magnetic shield are positioned so as to be separated by a first distance in the first direction;
in all unit groups, all first distances are substantially the same;
the current path and the magneto-electric conversion element that are included in the measurement unit shared between the current path and the magneto-electric conversion are positioned so as to be separated by a second distance in the first direction;
in all measurement units included in a unit group of the plurality of unit groups shared among the all measurement units, all second distances are substantially the same;
the second distance differs for each unit group;
a thickness of the first opposing part in the first direction is substantially constant;
a thickness of the second opposing part in the first direction is substantially constant;
the magneto-electric conversion element and the second magnetic shield that are included in the measurement unit shared between the magneto-electric conversion element and the second magnetic shield are positioned so as to be separated by a third distance in the first direction;
in all measurement units, the third distance is shorter than the second distance; and in all measurement units, all third distances are substantially the same;
all second magnetic shields are positioned on substantially same planes; all magneto-electric conversion elements are mounted on the substrate substantially like a single plane;

the first opposing part includes a plurality of first sub-opposing parts that are integral together,
each of the plurality of first sub-opposing parts is a substantially flat plate; the plurality of first sub-opposing parts are at positions shifted mutually in the first direction;
each of the plurality of first sub-opposing parts corresponds to one different unit group; and
the current paths and the first magnetic shields that are included in each of the plurality of unit groups are positioned in the first sub-opposing part corresponding to the current paths and the first magnetic shields.

2. The current sensor according to claim 1, wherein:
one of the plurality of unit groups is a large-current unit group;
another one of the plurality of unit groups is a small-current unit group configured to measure an induced magnetic field caused by a smaller current than in the large-current unit group;
the large-current unit group and the small-current unit group are adjacent to each other;
all first magnetic shields include a plate-like part expanding along a plane including the second direction;
all plate-like parts included in the large-current unit group expand along substantially a same plane;
all plate-like parts included in the small-current unit group expand along substantially a same plane;
the current path and the second magnetic shield that are included in the measurement unit shared between the current path and the second magnetic shield are positioned so as to be separated by a fourth distance in the first direction;
the fourth distance in the large-current unit group is larger than the fourth distance in the small-current unit group;
the first magnetic shield and the second magnetic shield that are included in the measurement unit shared between the first magnetic shield and the second magnetic shield are positioned so as to be separated by a fifth distance in the first direction;
the fifth distance in the large-current unit group is longer than the fifth distance in the small-current unit group;
the plate-like part included in the large-current unit group has a first edge close to the small-current unit group in the second direction, and also has a second edge distant from the small-current unit group in the second direction; and
of all first magnetic shields included in the large-current unit group, one or more first magnetic shields including the first magnetic shield closest to the small-current unit group have a first large-current protrusion extending from the first edge toward the second opposing part.

3. The current sensor according to claim 2, wherein a tip of the first large-current protrusion on a same side as the second opposing part in the first direction and one surface of the plate-like part of the first magnetic shield in the small-current unit group, the one surface being on the same side as the second opposing part, are positioned on substantially a same plane orthogonal to the first direction.

4. The current sensor according to claim 3, wherein shapes of all first magnetic shields included in the large-current unit group are substantially the same.

5. The current sensor according to claim 4, wherein each of one or more first magnetic shields including the first large-current protrusion has a second large-current protrusion extending from the second edge toward the second opposing part.

6. The current sensor according to claim 1, wherein:
one of the plurality of unit groups is a large-current unit group;
another one of the plurality of unit groups is a small-current unit group;
the large-current unit group and small-current unit group are adjacent to each other;
all first magnetic shields include a plate-like part expanding along a plane including the second direction;
all plate-like parts included in the large-current unit group expand along substantially a same plane;
all plate-like parts included in the small-current unit group expand along substantially a same plane;
the current path and the second magnetic shield that are included in the measurement unit shared between the current path and the second magnetic shield are positioned so as to be separated by a fourth distance in the first direction;
the fourth distance in the large-current unit group is larger than the fourth distance in the small-current unit group;
the first magnetic shield and the second magnetic shield that are included in the measurement unit shared between the first magnetic shield and the second magnetic shield are positioned so as to be separated by a fifth distance in the first direction;
the fifth distance in the large-current unit group is longer than the fifth distance in the small-current unit group;
the plate-like part included in the small-current unit group has a first edge close to the large-current unit group in the second direction, and also has a second edge distant from the large-current unit group in the second direction; and
of all first magnetic shields included in the small-current unit group, one or more first magnetic shields including the first magnetic shield closest to the large-current unit group have a first small-current protrusion extending from the first edge toward the second opposing part.

7. The current sensor according to claim 6, wherein:
in the measurement unit including the first small-current protrusion, a tip of the first small-current protrusion in the first direction, the tip being on a same side as the second opposing part, is at a position more distant from the second opposing part than from a center of the current path in the first direction; and
the first magnetic shield and the first small-current protrusion form an obtuse angle.

8. The current sensor according to claim 6, wherein shapes of all first magnetic shields included in the small-current unit group are substantially the same.

9. The current sensor according to claim 6, wherein each of one or more first magnetic shields including the first small-current protrusion has a second small-current protrusion extending from the second edge toward the second opposing part.

10. A current sensor comprising:
a first opposing part;
a second opposing part;
a first case made of a resin, the first case including the rst opposing part;
a second case made of a resin, the second case including the second opposing part;
a substrate mounted in at least one of the first case and the second case; and
a plurality of unit groups mounted in the first case and the second case, each unit group measuring an induced magnetic field; wherein:

the first opposing part and the second opposing part are positioned so as to be opposite to each other in a first direction;
the plurality of unit groups are arranged in a second direction intersecting the first direction;
each of the plurality of unit groups includes one or more measurement units arranged in the second direction;
each of the one or more measurement units includes:
  a first magnetic shield integral with the first opposing part,
  a second magnetic shield integral with the second opposing part,
  a current path integral with the first opposing part between the first magnetic shield and the second magnetic shield, and
  a magneto-electric conversion element configured to measure an induced magnetic field generated by a current flowing in the current path;
the magneto-electric conversion element is mounted, on the substrate, between the current path and the second magnetic shield in the first direction;
the current path and the first magnetic shield that are included in a measurement unit of the one or more measurement units shared between the current path and the first magnetic shield are positioned so as to be separated by a first distance in the first direction;
in all unit groups, all first distances are substantially the same;
the current path and the magneto-electric conversion element that are included in the measurement unit shared between the current path and the magneto-electric conversion are positioned so as to be separated by a second distance in the first direction;
in all measurement units included in a unit group of the plurality of unit groups shared among the all measurement units, all second distances are substantially the same;
the second distance differs for each unit group;
a thickness of the first opposing part in the first direction is substantially constant;
a thickness of the second opposing part in the first direction is substantially constant;
the magneto-electric conversion element and the second magnetic shield that are included in the measurement unit shared between the magneto-electric conversion element and the second magnetic shield are positioned so as to be separated by a third distance in the first direction;
in all measurement units, the third distance is shorter than the second distance; and in all measurement units, all third distances are substantially the same;
each of the plurality of unit groups includes the same number of measurement units;
the second opposing part includes a plurality of second sub-opposing parts having substantially same shapes;
the substrate includes a plurality of sub-substrates having substantially same shapes;
one second sub-opposing part and one sub-substrate correspond to one of the plurality of unit groups;
the second sub-opposing part and the sub-substrate that correspond to the same unit group are mutually secured;
in each second sub-opposing part, all second magnetic shields included in the unit group corresponding to the second sub-opposing part are mounted; and
on each sub-substrate, all magneto-electric conversion elements included in the unit group corresponding to the sub-substrate are mounted.

11. The current sensor according to claim 10, wherein:
all current paths are positioned on substantially a same plane; and
all first magnetic shields are positioned on substantially the same planes.

12. The current sensor according to claim 1, wherein:
all current paths are positioned on substantially a same plane;
all first magnetic shields are positioned on substantially a same plane;
the substrate has a first mounting surface on a same side as the first opposing part, and also has a second mounting surface on a same side as the second opposing part;
all magneto-electric conversion elements included in one or more unit groups are mounted on the first mounting surface; and
all magneto-electric conversion elements included in another one or more unit groups are mounted on the second mounting surface.

13. The current sensor according to claim 12, wherein all second magnetic shields are positioned on substantially the same planes.

14. The current sensor according to claim 12, wherein:
one of the plurality of unit groups is a large-current unit group;
another one of the plurality of unit groups is a small-current unit group;
the current path and the second magnetic shield that are included in the measurement unit shared between the current path and the second magnetic shield are positioned so as to be separated by a fourth distance in the first direction; and
the fourth distance in the large-current unit group differs from the fourth distance in the small-current unit group.

15. The current sensor according to claim 14, wherein:
the magneto-electric conversion element and the second magnetic shield that are included in the measurement unit shared between the magneto-electric conversion element and the second magnetic shield are positioned so as to be separated by a third distance in the first direction; and
in all measurement units, all third distances are substantially the same.

16. The current sensor according to claim 12, wherein
one of the plurality of unit groups is a large-current unit group;
another one of the plurality of unit groups is a small-current unit group;
the second magnetic shield and the magneto-electric conversion element that are included in the measurement unit shared between the second magnetic shield and the magneto-electric conversion element are positioned so as to be separated by a third distance in the first direction; and
the third distance in the large-current unit group is shorter than the third distance in the small-current unit group.

17. The current sensor according to claim 12, wherein
one of the plurality of unit groups is a large-current unit group;
another one of the plurality of unit groups is a small-current unit group;
the second magnetic shield and the magneto-electric conversion element that are included in the measurement unit shared between the second magnetic shield and the magneto-electric conversion element are positioned so as to be separated by a third distance in the first direction; and the third distance in the large-current unit group is longer than the third distance in the small-current unit group.

18. A current sensor comprising:
a first opposing part;
a second opposing part;
a first case made of a resin, the first case including the first opposing part;
a second case made of a resin, the second case including the second opposing part;
a substrate mounted in at least one of the first case and the second case; and
a plurality of unit groups mounted in the first case and the second case, each unit group measuring an induced magnetic field; wherein:
the first opposing part and the second opposing part are positioned so as to be opposite to each other in a first direction;
the plurality of unit groups are arranged in a second direction intersecting the first direction;
each of the plurality of unit groups includes one or more measurement units arranged in the second direction;
each of the one or more measurement units includes:
 a first magnetic shield integral with the first opposing part,
 a second magnetic shield integral with the second opposing part,
 a current path integral with the first opposing part between the first magnetic shield and the second magnetic shield, and
 a magneto-electric conversion element configured to measure an induced magnetic field generated by a current flowing in the current path;
the magneto-electric conversion element is mounted, on the substrate, between the current path and the second magnetic shield in the first direction;
the current path and the first magnetic shield that are included in a measurement unit shared between the current path and the first magnetic shield are positioned so as to be separated by a first distance in the first direction;
in all unit groups, all first distances are substantially the same;
the current path and the magneto-electric conversion element that are included in the measurement unit shared between the current path and the magneto-electric conversion are positioned so as to be separated by a second distance in the first direction;
in all measurement units included in a unit group of the plurality of unit groups shared among the all measurement units, all second distances are substantially the same;
the second distance differs for each unit group;
a thickness of the first opposing part in the first direction is substantially constant;
a thickness of the second opposing part in the first direction is substantially constant;
the magneto-electric conversion element and the second magnetic shield that are included in the measurement unit shared between the magneto-electric conversion element and the second magnetic shield are positioned so as to be separated by a third distance in the first direction;
in all measurement units, the third distance is shorter than the second distance; and in all measurement units, all third distances are substantially the same;
all second magnetic shields are positioned on substantially same planes; all magneto-electric conversion elements are mounted on the substrate substantially like a single plane;
the first opposing part includes a plurality of first sub-opposing parts that are integral together;
each of the plurality of first sub-opposing parts is a substantially flat plate; the plurality of first sub-opposing parts are at positions shifted mutually in the first direction;
each of the plurality of first sub-opposing parts corresponds to one different unit group;
the current paths and the first magnetic shields that are included in each of the plurality of unit groups are positioned in the first sub-opposing part corresponding to the current paths and the first magnetic shields; and
the shapes of all first magnetic shields are substantially the same.

* * * * *